(12) United States Patent
Shao et al.

(10) Patent No.: US 12,490,423 B2
(45) Date of Patent: Dec. 2, 2025

(54) SEMICONDUCTOR STRUCTURE AND METHOD FOR MANUFACTURING SEMICONDUCTOR STRUCTURE

(71) Applicant: CHANGXIN MEMORY TECHNOLOGIES, INC., Hefei (CN)

(72) Inventors: Guangsu Shao, Hefei (CN); Deyuan Xiao, Hefei (CN)

(73) Assignee: CHANGXIN MEMORY TEHCNOLOGIES, INC., Hefei (CN)

( * ) Notice: Subject to any disclaimer, the term of this patent is extended or adjusted under 35 U.S.C. 154(b) by 618 days.

(21) Appl. No.: 17/940,952

(22) Filed: Sep. 8, 2022

(65) Prior Publication Data
US 2023/0005920 A1 Jan. 5, 2023

Related U.S. Application Data

(63) Continuation of application No. PCT/CN2022/094233, filed on May 20, 2022.

(30) Foreign Application Priority Data

Apr. 26, 2022 (CN) .......................... 202210446041.8

(51) Int. Cl.
*H01L 27/108* (2006.01)
*H10B 12/00* (2023.01)

(52) U.S. Cl.
CPC ............ *H10B 12/30* (2023.02); *H10B 12/03* (2023.02)

(58) Field of Classification Search
CPC ...... H10B 12/30; H10B 12/03; H10B 12/033; H10B 12/31; H10D 1/716; H10D 1/714; H10D 1/711; H01L 22/32; H01L 23/544
See application file for complete search history.

(56) References Cited

U.S. PATENT DOCUMENTS

2020/0111793 A1 4/2020 Kim et al.
2020/0126994 A1 4/2020 Huang
(Continued)

FOREIGN PATENT DOCUMENTS

JP H0629479 A 2/1994
JP H09266292 A 10/1997
(Continued)

OTHER PUBLICATIONS

Japanese Patent Office, Office Action Issued in Application No. 2022-562336, Jun. 4, 2024, 9 pages.

*Primary Examiner* — Mohammed R Alam
(74) *Attorney, Agent, or Firm* — Kilpatrick Townsend & Stockton LLP

(57) ABSTRACT

The semiconductor structure includes a first capacitive structure located on a substrate and first support columns. A plurality of first support columns are disposed on the substrate in parallel and spaced apart from each other, and are located in a same plane parallel to the substrate. The first capacitive structure includes a first lower electrode layer, a first dielectric layer and a first upper electrode layer. The semiconductor structure further includes a plurality of first segmentation trenches. The first segmentation trenches divide the first capacitive structure into a plurality of capacitors. A first insulation layer is disposed between the corresponding first lower electrode layers of the adjacent capacitors. The corresponding first upper electrode layers of the adjacent capacitors are electrically connected to each other.

18 Claims, 45 Drawing Sheets

(56) References Cited

U.S. PATENT DOCUMENTS

| | | |
|---|---|---|
| 2021/0375875 A1 | 12/2021 | Brewer et al. |
| 2023/0157004 A1 | 5/2023 | Kang et al. |
| 2023/0253447 A1* | 8/2023 | Kim ................. H10D 1/694 |
| | | 438/239 |
| 2023/0307351 A1* | 9/2023 | Kao ................. H10D 1/716 |

FOREIGN PATENT DOCUMENTS

| | | |
|---|---|---|
| JP | H10107224 A | 4/1998 |
| JP | 2010205904 A | 9/2010 |
| JP | 2016100596 A | 5/2016 |
| KR | 20210102094 A | 8/2021 |
| KR | 20210148939 | 12/2021 |

* cited by examiner

SEMICONDUCTOR STRUCTURE AND METHOD FOR MANUFACTURING SEMICONDUCTOR STRUCTURE

CROSS-REFERENCE TO RELATED APPLICATION

This is a continuation application of International Patent Application No. PCT/CN2022/094233, filed on May 20, 2022, which claims priority to Chinese Patent Application No. 202210446041.8, filed on Apr. 26, 2022 and entitled "SEMICONDUCTOR STRUCTURE AND METHOD FOR MANUFACTURING SEMICONDUCTOR STRUCTURE". The disclosures of these applications are incorporated by reference herein in their entireties.

TECHNICAL FIELD

The disclosure relates to the technical field of semiconductor manufacturing, and in particular, to a semiconductor structure and a method for manufacturing a semiconductor structure.

BACKGROUND

A Dynamic Random Access Memory (DRAM) is a common semiconductor apparatus in an electronic device such as a computer, which is formed by a plurality of storage units. Each storage unit generally includes a transistor and a capacitor. A gate of the transistor is electrically connected to a word line, a source is electrically connected to a bit line, and a drain is electrically connected to the capacitor. A word line voltage on the word line can control the turning on and off of the transistor, so that data information stored in the capacitor can be read through the bit line or written into the capacitor. The capacitor generally includes an upper electrode layer, a dielectric layer and a lower electrode layer that are stacked. However, there is also a problem relating to small capacitor capacity in the related art.

SUMMARY

A first aspect of an embodiment of the disclosure provides a semiconductor structure, including a first capacitive structure and first support columns located on a substrate. A plurality of first support columns are disposed on the substrate in parallel and spaced apart from each other, and are located in a same plane parallel to the substrate. The first capacitive structure includes a first lower electrode layer, a first dielectric layer and a first upper electrode layer. The first lower electrode layer covers the substrate and sidewall surfaces of the first support columns, the first dielectric layer covers the first lower electrode layer. The first upper electrode layer covers the first dielectric layer.

The semiconductor structure further includes a plurality of first segmentation trenches that are disposed on the substrate in parallel and spaced apart from each other. An extending direction of the first segmentation trenches is perpendicular to the first support columns. The first segmentation trenches divide the first capacitive structure into a plurality of capacitors. A first insulation layer is disposed between the corresponding first lower electrode layers of the adjacent capacitors. The first insulation layer covers the sidewall surface of the first support column corresponding to the first segmentation trench and the substrate. The corresponding first upper electrode layers of the adjacent capacitors are electrically connected to each other.

A second aspect of an embodiment of the disclosure provides a method for manufacturing a semiconductor structure. The method includes the following operations.

A substrate is provided.

A plurality of first support columns are formed. The plurality of first support columns are disposed on the substrate in parallel and spaced apart from each other, and are located in a same plane parallel to the substrate.

A first capacitive structure is formed. The first capacitive structure includes a first lower electrode layer, a first dielectric layer and a first upper electrode layer. The first lower electrode layer covers the substrate and sidewall surfaces of the first support columns. The first dielectric layer covers the first lower electrode layer. The first upper electrode layer covers the first dielectric layer.

A plurality of first segmentation trenches are formed. The plurality of first segmentation trenches are disposed on the substrate in parallel and spaced apart from each other. An extending direction of the first segmentation trenches is perpendicular to the first support columns. The first segmentation trenches divide the first capacitive structure into a plurality of capacitors.

A first insulation layer is formed in the first segmentation trench. The first insulation layer is disposed between the first lower electrode layers of the adjacent capacitors. The first insulation layer covers the sidewall surface of the first support column corresponding to the first segmentation trench and the substrate.

A conductive material is formed into the first segmentation trench, to electrically connect the corresponding first upper electrode layers of the adjacent capacitors to one another.

BRIEF DESCRIPTION OF THE DRAWINGS

FIG. 1A is a schematic view of forming a first support layer in the method for manufacturing a semiconductor structure.

DETAILED DESCRIPTION

In order to make the above purposes, features and advantages of the embodiments of the disclosure more obvious and easy to understand, the technical solutions in the embodiments of the disclosure will be clearly and completely described below with reference to the drawings in the embodiments of the disclosure. It is apparent that the described embodiments are only part of the embodiments of the present invention, not all the embodiments. Based on the embodiments in the present invention, all other embodiments obtained by those of ordinary skilled in the art without creative work shall fall within the protection scope of the present invention.

Figure 1A:
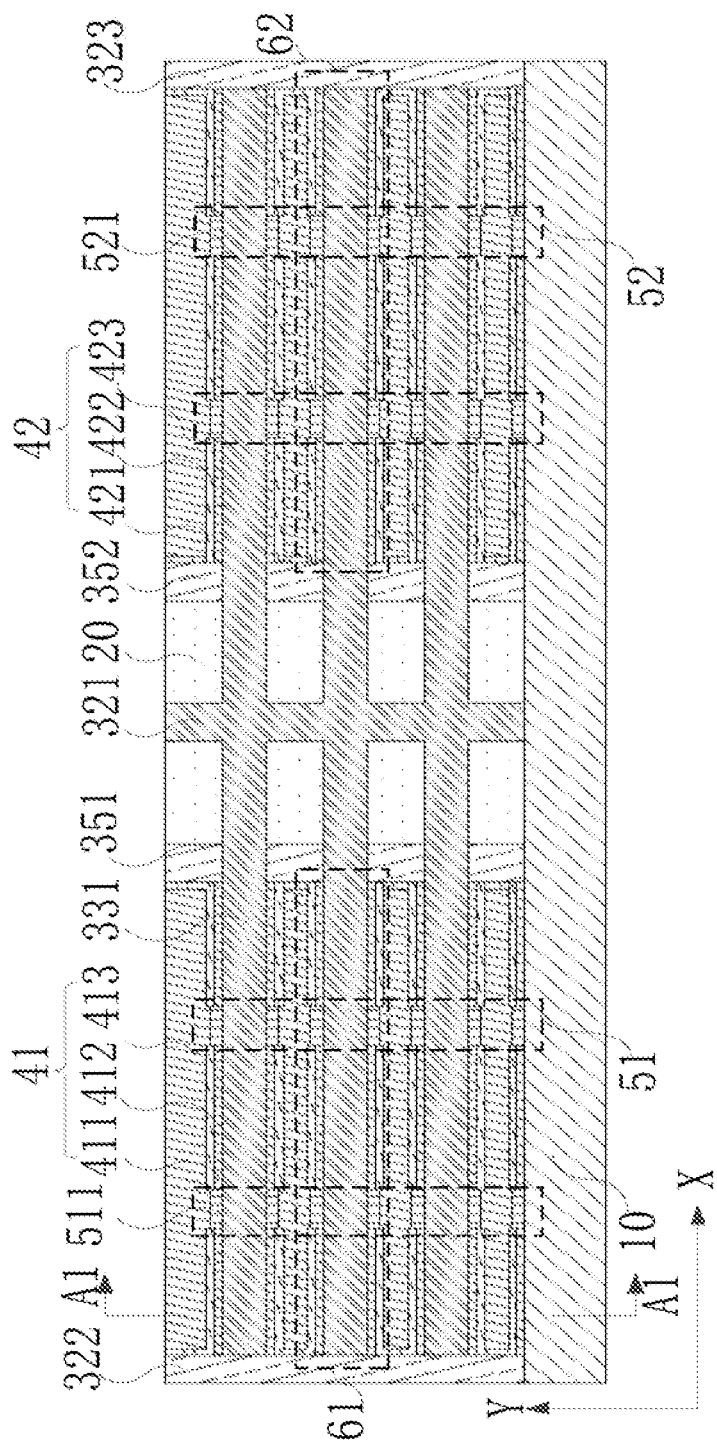
FIG. 1A is a schematic view of a semiconductor structure according to an embodiment of the disclosure.
Figure 1B:
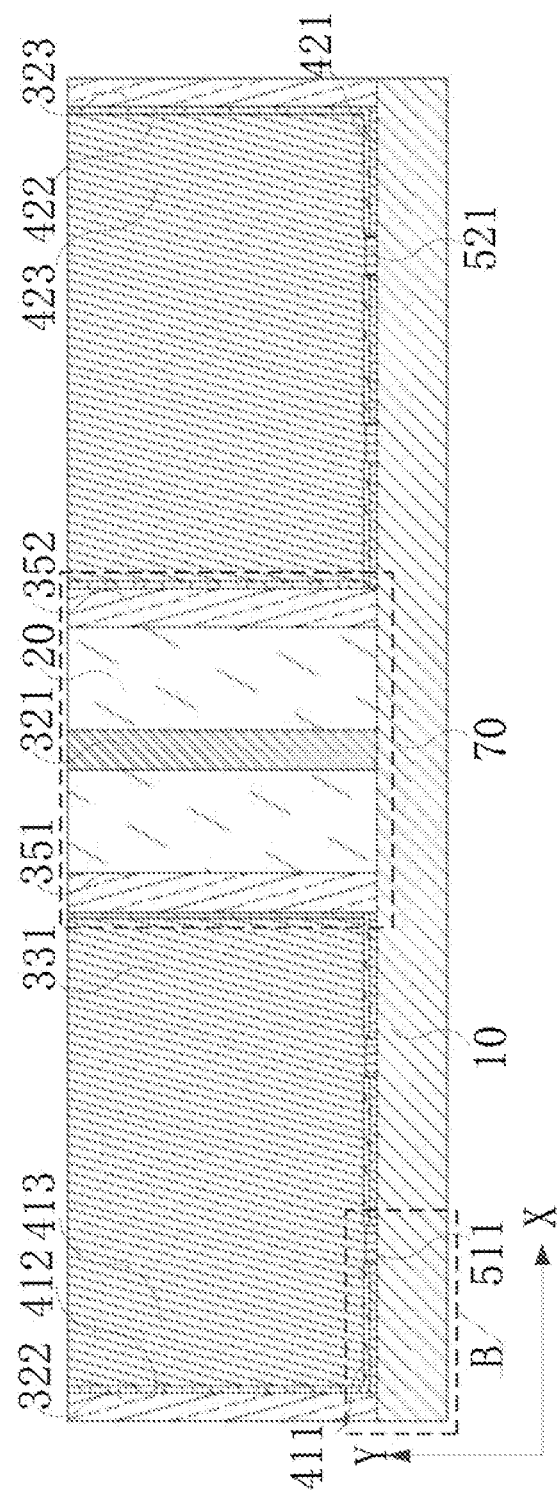
FIG. 1B is another schematic view of a semiconductor structure according to an embodiment of the disclosure.
Figure 1C:
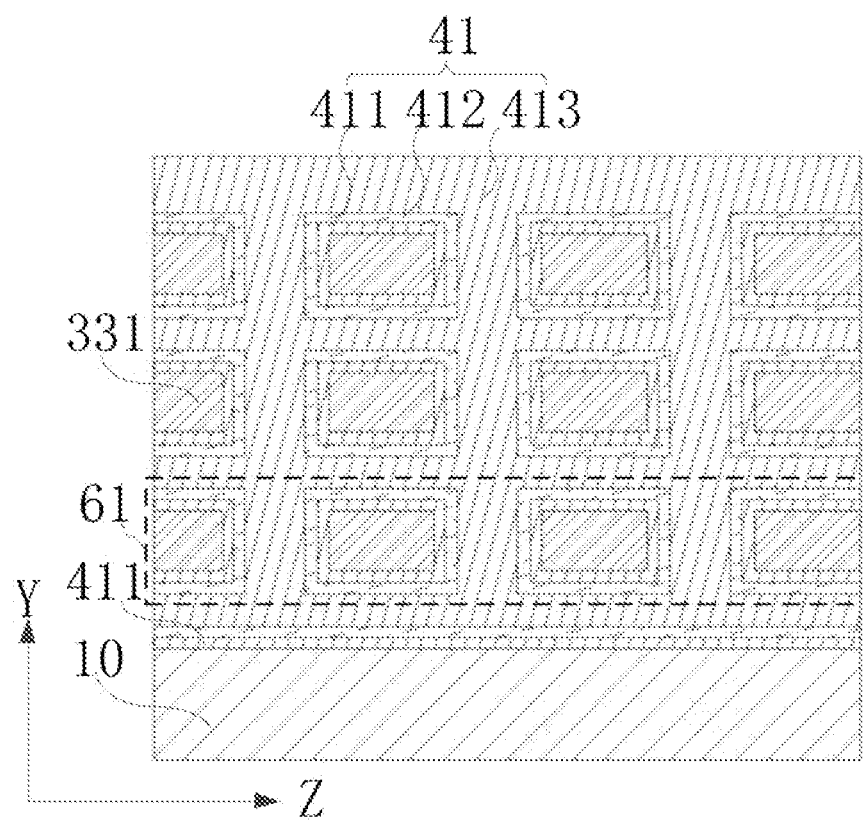
FIG. 1C is a cross-sectional view of A1-A1 in FIG. 1A.

Referring to FIG. 1A, FIG. 1B and FIG. 1C, an embodiment of the disclosure provides a semiconductor structure, including a first capacitive structure 41 and first support columns 331 located on a substrate 10.

As shown in FIG. 1C, in a Z-axis direction, a plurality of first support columns 331 are disposed on the substrate 10 in parallel and are spaced apart from each other. The first support columns are located in a same plane parallel to the substrate 10. The first capacitive structure 41 may be supported by the plurality of first support columns 331, and thus the capacitive structure is prevented from collapsing. In some embodiments, a material of each first support column 331 includes single-crystal silicon, single-crystal germanium, single-crystal silicon germanium, or Indium Gallium Zinc Oxide (IGZO), so that the first support columns 331 are sufficient to support the first capacitive structure 41. The IGZO is an amorphous oxide containing indium, gallium and zinc, which has desirable carrier migration performance. In this embodiment, the material of the first support columns 331 may be IGZO, so that the performance of the first capacitive structure 41 is improved.

The first capacitive structure 41 includes a first lower electrode layer 411, a first dielectric layer 412 and first upper electrode layers 413. The first lower electrode layer 411 covers sidewall surfaces of the first support columns 331 and the substrate 10. The first dielectric layer 412 covers the first lower electrode layer 411. It can be seen, from FIG. 1A and FIG. 1C, that, in the first capacitive structure 41, a part of the first lower electrode layer 411 is disposed around the first support columns 331; a part of the first dielectric layer 412 is disposed around the first lower electrode layer 411; and a part of the first lower electrode layer 411 and a part of the first dielectric layer 412 also cover the substrate 10. In the first capacitive structure 41, the first upper electrode layer 413 covers the first dielectric layer 412.

As shown in FIG. 1A and FIG. 1C, in this embodiment, the plurality of first support columns 331 and the first capacitive structure 41 together form first capacitive assemblies 61. In a direction perpendicular to the substrate 10 (that is, in a Y-axis direction), a plurality of first capacitive assemblies 61 arranged in stack are disposed on the substrate 10. For example, three first capacitive assemblies 61 arranged in stack may be disposed on the substrate 10. The corresponding first upper electrode layers 413 of the adjacent first capacitor assemblies 61 are electrically connected to each other. For example, the corresponding first upper electrode layers 413 of the adjacent first capacitive assemblies 61 may be connected to each other by means of a conductive layer. A material of the conductive layer may be, for example, metal or metal alloy. As shown in FIG. 1C, in the direction perpendicular to the substrate 10 (that is, in the Y-axis direction), the corresponding first upper electrode layers 413 of the adjacent first capacitive assemblies 61 may be further directly bonded together, to cause the adjacent first capacitive assemblies 61 to share one same first upper electrode layer 413.

As shown in FIG. 1A and FIG. 1B, in an X-axis direction, the semiconductor structure further includes a plurality of first segmentation trenches 51 that are disposed on the substrate 10 in parallel and spaced apart from each other. The first segmentation trenches 51 divide the first capacitive structure 41 into a plurality of capacitors. For example, in this embodiment, there may be two first segmentation trenches 51. An extending direction of the first segmentation trenches 51 is perpendicular to an extending direction of the first support columns 331. In addition, the extending direction of the first segmentation trenches 51 is also perpendicular to the substrate 10. The two first segmentation trenches 51 may divide the first capacitive structure 41 into three capacitors distributed in the X-axis direction. In the embodiment where the plurality of first capacitive assemblies 61 arranged in stack are disposed on the substrate 10, the first segmentation trenches 51 may further divide the plurality of first capacitive assemblies 61 to the plurality of capacitors. For example, in this embodiment, there are three first capacitive assemblies 61, and each first capacitive assembly 61 is divided into three capacitors by two first segmentation trenches 51. That is to say, in this embodiment, nine capacitors are disposed on the substrate 10 in total.

Continuously referring FIG. 1A and FIG. 1B, in any first capacitive assembly 61, in the X-axis direction, a first insulation layer 511 is disposed between the corresponding first lower electrode layers 411 of the adjacent capacitors. The first insulation layer 511 covers the sidewall surface of the first support column 331 corresponding to the first segmentation trench 51 and the substrate 10, to isolate the corresponding first lower electrode layers 411 of the adjacent capacitors by means of the first insulation layer 11. In this embodiment, the first insulation layer 511 is located in an area where the first segmentation trenches 51 are located. Part of the first insulation layer 511 is disposed around the first support columns 331, and also covers the substrate 10. In a direction parallel to the substrate 10, the corresponding first upper electrode layers 413 of the adjacent capacitors are electrically connected to each other. For example, the corresponding first upper electrode layers 413 of the adjacent capacitors may be connected to each other by means of the conductive layer. The material of the conductive layer may be, for example, metal or metal alloy. As shown in FIG. 1A, the corresponding first upper electrode layers 413 of the adjacent capacitors may be further directly bonded together. That is to say, the corresponding first upper electrode layers 413 of the adjacent capacitors also cover the first insulation layer 511, to cause the adjacent capacitors to share the same first upper electrode layer 413. Through the arrangement of the above structure, the corresponding first lower electrode layers 411 of the adjacent capacitors may be electrically connected to each other by the first support columns 331, and the corresponding first upper electrode layers 413 of the adjacent capacitors are electrically connected to each other, so that the adjacent capacitors can be connected in parallel, thereby increasing the capacitance of the first capacitive assembly 61 can be increased. Therefore, the performance of the semiconductor structure can be improved.

The semiconductor structure provided in the embodiments of the disclosure includes the first capacitive structure 41 located on the substrate 10 and the first support columns 331. The plurality of first support columns 331 are disposed on the substrate 10 in parallel and spaced apart from each other, and are located in the same plane parallel to the substrate 10. The first capacitive structure 41 includes the first lower electrode layer 411, the first dielectric layer 412 and the first upper electrode layer 413. The first lower electrode layer 411 covers the sidewall surfaces of the first support columns 331 and the substrate 10. The first dielectric layer 412 covers the first lower electrode layer 411. The first upper electrode layer 413 covers the first dielectric layer 412. The plurality of first segmentation trenches SI that are disposed on the substrate 10 in parallel and spaced apart from each other are further included. The extending direction of the first segmentation trenches 51 is perpendicular to the first support columns 331. The first segmentation trenches 51 divide the first capacitive structure 41 to the plurality of capacitors. The first insulation layer 511 is disposed between the corresponding first lower electrode layers 411 of the adjacent capacitors. The first insulation layer 511 covers the sidewall surface of the first support column 331 corresponding to the first segmentation trench 51 and the substrate 10. The corresponding first upper electrode layers 413 of the adjacent capacitors are electrically connected to each other. The first insulation layer 511 isolates the adjacent capacitors, the corresponding first lower electrode layers 411 of the adjacent capacitors are electrically connected to each other by using the first support column 331, and the corresponding first upper electrode layers 413 of the adjacent capacitors are electrically connected to each other, so that a parallel connection between the adjacent capacitors can be realized, thereby increasing capacitance. Therefore, the performance of the semiconductor structure can be improved.

In some embodiments, a material of the first insulation layer 511 may include a material having a high dielectric constant, silicon oxide, silicon nitride or silicon oxynitride, to enhance an insulation effect between the corresponding first lower electrode layers 411 of the adjacent capacitors. In this embodiment, the material of the first insulation layer 511 may be the material having a high dielectric constant. The material having a high dielectric constant refers to a material of which dielectric constant is higher than silica, which has desirable insulativity. For example, the material having a high dielectric constant may include a ferroelectric material, metal oxide, and the like. In this embodiment, the material of the first insulation layer 511 may be the material having a high dielectric constant, so that insulation between the corresponding first lower electrode layers 411 of the adjacent capacitors is further improved. Therefore, a parallel connection between the adjacent capacitors is realized.

Figure 1D:
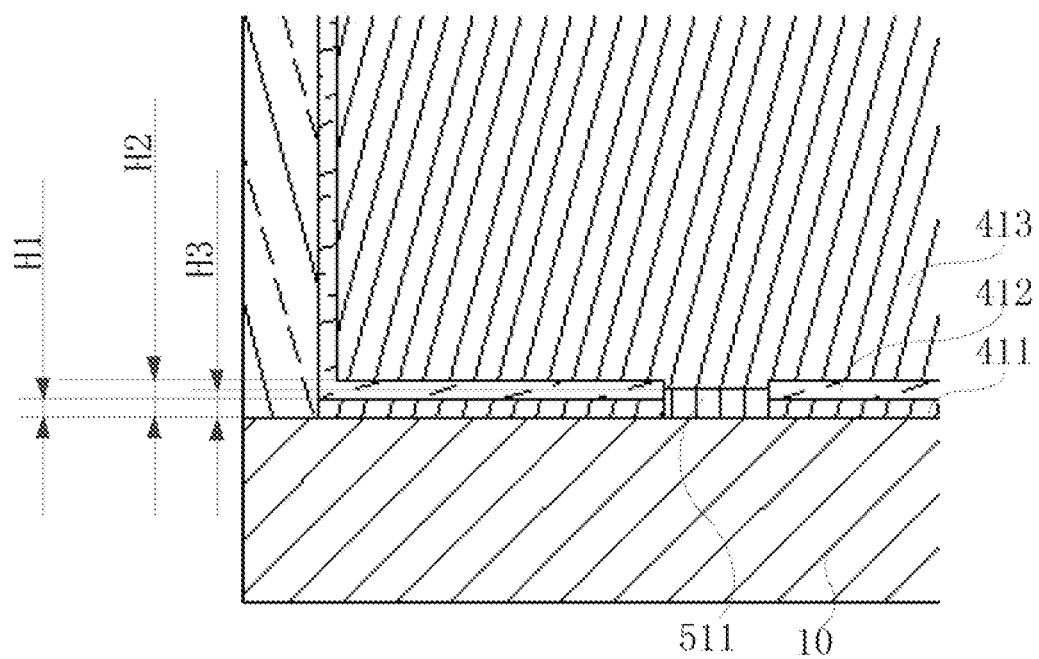
FIG. 1D is a partial enlarged view of B in FIG. 1C.

Referring to FIG. 1D, a thickness H3 of the first insulation layer 511 is greater than a thickness H1 of the first lower electrode layer 411, and is less than a sum 112 of thicknesses of the first lower electrode layer 411 and the first dielectric layer 412. The thickness H3 of the first insulation layer 511 is greater than the thickness H1 of the first lower electrode layer 411, so that the insulation between the corresponding first lower electrode layers 411 of the adjacent capacitors is guaranteed. In addition, the thickness H3 of the first insulation layer 511 is less than the sum H2 of thicknesses of the first lower electrode layer 411 and the first dielectric layer 412, that is, a plane of the first insulation layer 511 is located between the first dielectric layer 412 and the first lower electrode layer 411, so that electrical connection between the corresponding first upper electrode layers 413 of the adjacent capacitors can be facilitated, thereby guaranteeing the parallel connection between the adjacent capacitors.

Referring to FIG. 1A and FIG. 1B, the semiconductor structure further includes a first support layer 351 and a second support layer 322 covering the substrate 10. In this embodiment, the first support layer 351 may be disposed on a right side of the first capacitive assembly 61, and the second support layer 322 may be disposed on a left side of the first capacitive assembly 61, so that the first capacitive assembly 61 is located between the first support layer 351 and the second support layer 322. The first support layer 351 and the second support layer 322 surround the sidewall surfaces of the first support columns 331, the first support columns 331 are disposed on the substrate 10 by means of the first support layer 351 and the second support layer 322. In some embodiments, materials of the first support layer 351 and the second support layer 322 may include silicon nitride, silicon oxynitride, or silicon oxide. Continuously referring to FIG. 1A and FIG. 1B, the first dielectric layer 412 further covers sidewalls of the first support layer 351 and the second support layer 322, so that the insulations between the first upper electrode layer 413 and the first support layer 351 and between the first upper electrode layer and the second support layer 322 are guaranteed.

In this embodiment, the semiconductor structure further includes an isolation portion 70 located on the substrate 10 and a plurality of second capacitive assemblies 62. In the direction perpendicular to the substrate 10 (that is, in the Y-axis direction), the plurality of second capacitive assemblies 62 arranged in stack are disposed on the substrate 10. The isolation portion 70 is located between the first capacitive assemblies 61 and the second capacitive assemblies 62. The second capacitive assemblies 62 and the first capacitive assemblies 61 are symmetrically disposed with respect to the isolation portion 70. As shown in FIG. 1A, the first capacitive assemblies 61 are located on a left side of the isolation portion 70, and a second capacitive structure 42 is located on a right side of the isolation portion 70. In addition, the structure of the second capacitive assemblies 62 is the same as that of the first capacitive assemblies 61.

It is to be noted that, materials of same layer structures in the first capacitive assemblies 61 and the second capacitive assemblies 62 are the same, so that the first capacitive assemblies 61 and the second capacitive assemblies 62 may be synchronously formed.

Referring to FIG. 1A and FIG. 1B, in the direction perpendicular to the substrate 10 (that is, in the Y-axis direction), the plurality of second capacitive assemblies 62 arranged in stack are disposed on the substrate 10, and the adjacent second capacitive assemblies 62 are connected to each other. Each second capacitive assembly 62 includes a plurality of second support columns 332 and the second capacitive structure 42. The plurality of second support columns 332 are disposed on the substrate 10 in parallel and spaced apart from each other, and each second support column 332 is connected to the corresponding first support column 331. The second capacitive structure 42 includes a second lower electrode layer 421, a second dielectric layer 422 and a second upper electrode layer 423. The second lower electrode layer 421 covers the substrate 10 and sidewalls of the second support columns 332. The second dielectric layer 422 covers the second lower electrode layer 421. The second upper electrode layer 423 covers the second dielectric layer 422. It may be seen that, the corresponding second upper electrode layers 423 of the adjacent second capacitive assemblies 62 are electrically connected to each other. As shown in FIG. 1A, the corresponding second upper electrode layers 423 of the adjacent capacitors may be directly bonded together. That is to say, the corresponding second upper electrode layers 423 of the adjacent capacitors also cover a second insulation layer 521, so that the corresponding second upper electrode layers 423 of the adjacent capacitors are electrically connected to one another. Through the arrangement of the above structure, the corresponding second lower electrode layers 421 of the adjacent capacitors may be electrically connected to each other by the second support columns 332, and the corresponding second upper electrode layers 423 of the adjacent capacitors are electrically connected to each other, so that a parallel connection between the adjacent capacitors can be realized, thereby increasing the capacitance of the second capacitive assembly 62 can be increased. Therefore, the performance of the semiconductor structure can be improved.

The plurality of second capacitive assemblies 62 further include a plurality of second segmentation trenches 52 that are disposed on the substrate 10 in parallel and spaced apart from each other. An extending direction of the second segmentation trenches 52 is perpendicular to the second support columns 332. The second segmentation trenches 52 divide the second capacitive structure 42 at any layer into a plurality of capacitors. In any second capacitive assembly 62, in the direction parallel to the substrate 10 (that is, in the X-axis direction), a second insulation layer 521 is disposed between the second lower electrode layers 421 of the adjacent capacitors. The second insulation layer 521 covers the substrate 10 and the sidewall surface of the second support column 332 corresponding to the second segmentation trench 52, and the corresponding second upper electrode layers 423 of the adjacent capacitors are connected to each other, to isolate the corresponding second lower electrode layers 421 of the adjacent capacitors from each other by means of the second insulation layer 521.

Likewise, a third support layer 352 is disposed on a left side of the second capacitive assembly 62, and a fourth support layer 323 is disposed on a right side of the second capacitive assembly 62, so that the second capacitive assembly 62 is located between the third support layer 352 and the fourth support layer 323. The third support layer 352 and the fourth support layer 323 surround the sidewall surfaces of the second support columns 332. In this way, the second support columns 332 are disposed on the substrate 10 by means of the third support layer 352 and the fourth support layer 323. The second dielectric layer 422 further covers sidewalls of the third support layer 352 and the fourth support layer 323, so that the insulations between the second upper electrode layer 423 and the third support layer 352 and between the second upper electrode layer and the fourth support layer 323 are guaranteed.

Referring to FIG. 1A and FIG. 1B, the isolation portion 70 is further located between the first support layer 351 and the third support layer 352, and is also disposed around the sidewalls of the first support column 331 and the second support column 332. The isolation portion 70 further includes an intermediate support layer 321. One side of the intermediate support layer 321 is connected to the first support column 331, and the other side of the intermediate support layer 321 is connected to the second support column 332. In this way, the first support column 331 and the second support column 332 are electrically connected together by means of the intermediate support layer 321. In this embodiment, since the intermediate support layer 321, the first support column 331 and the second support column 332 have a same material, the intermediate support layer, the first support column and the second support column are synchronously formed by means of a same deposition process. Therefore, the production efficiency of the semiconductor structure can be enhanced. The isolation portion 70 further includes a sacrificial layer 20. Part of the sacrificial layer 20 is located between the intermediate support layer 321 and the first support layer 351, and is disposed around the sidewall of the first support column 331. Part of the sacrificial layer 20 is also located between the intermediate support layer 321 and the second support layer 322, and is disposed around the sidewall of the second support column 332.

Figure 2:
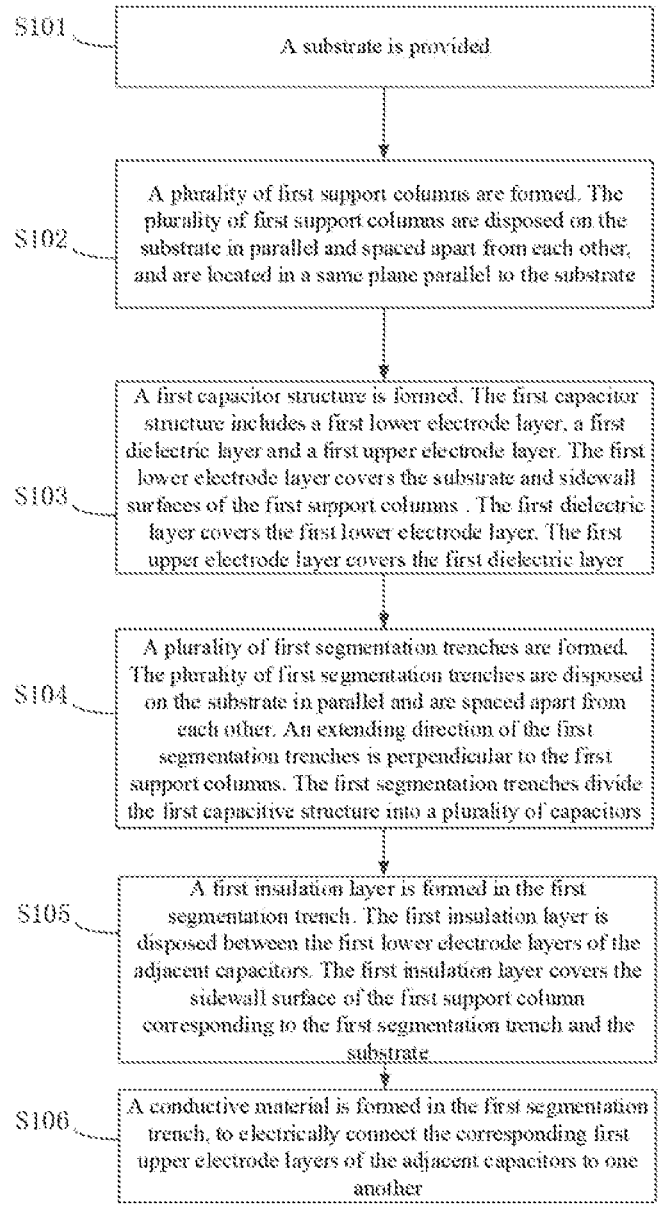
FIG. 2 is a flowchart of steps of a method for manufacturing a semiconductor structure according to an embodiment of the disclosure.

An embodiment of the disclosure further provides a method for manufacturing a semiconductor structure. Referring to FIG. 2, the method includes S101 to S105.

At S101, a substrate is provided.

In this embodiment, the substrate may be a semiconductor substrate, such as single-crystal silicon, polysilicon or silicon or Silicon Germanium (SiGe) of an amorphous structure, or may be a mixed semiconductor structure, such as silicon carbide, indium antimonide, lead telluride, indium arsenide, indium phosphide, gallium arsenide or gallium antimonide, an alloy semiconductor, or a combination thereof. This embodiment is not limited thereto.

Referring to FIG. 3 to FIG. 8C below, after the substrate 10 is provided, the method further includes the follows.

At S102, a plurality of first support columns are formed. The plurality of first support columns are disposed on the substrate in parallel and are spaced apart from each other. The first support columns are located in a same plane parallel to the substrate.

Figure 3:
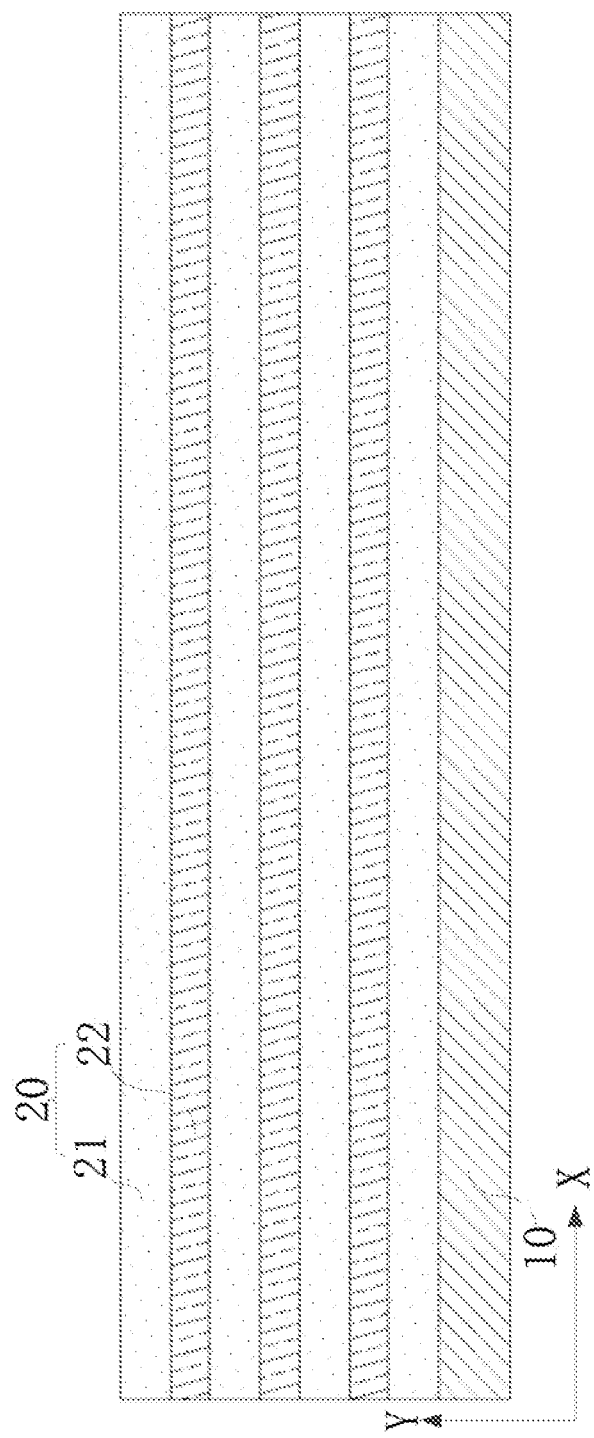
FIG. 3 is a schematic view of forming a sacrificial layer on a substrate in the method for manufacturing a semiconductor structure.

Referring to FIG. 3, in this embodiment, the forming the plurality of first support columns 331 includes: forming a sacrificial layer 20 covering the substrate 10. The sacrificial layer 20 includes a first sacrificial layer 21 and a second sacrificial layer 22 that are alternately arranged and stacked onto one another. For example, in this embodiment, a plurality of first sacrificial layers 21 and a plurality of second sacrificial layers 22 may be provided. The second sacrificial layer 22 is sandwiched between the two adjacent first sacrificial layers 21. Part of the first sacrificial layers 21 cover the substrate 10, so that the first sacrificial layers 21 and the second sacrificial layers 22 are alternately stacked on the substrate 10. In some embodiments, a material of the first sacrificial layer 21 may include oxide, and a material of the second sacrificial layer 22 may include nitride, so that the material of the first sacrificial layer 21 is different from that of the second sacrificial layer 22, to allow part of the sacrificial layer 20 to be selectively etched in the subsequent operation.

In some other embodiments, the sacrificial layer 20 may include one first sacrificial layer 21 and one second sacrificial layer 22 only. The first sacrificial layer 21 is located between the second sacrificial layer 22 and the substrate 10.

Figure 4A:
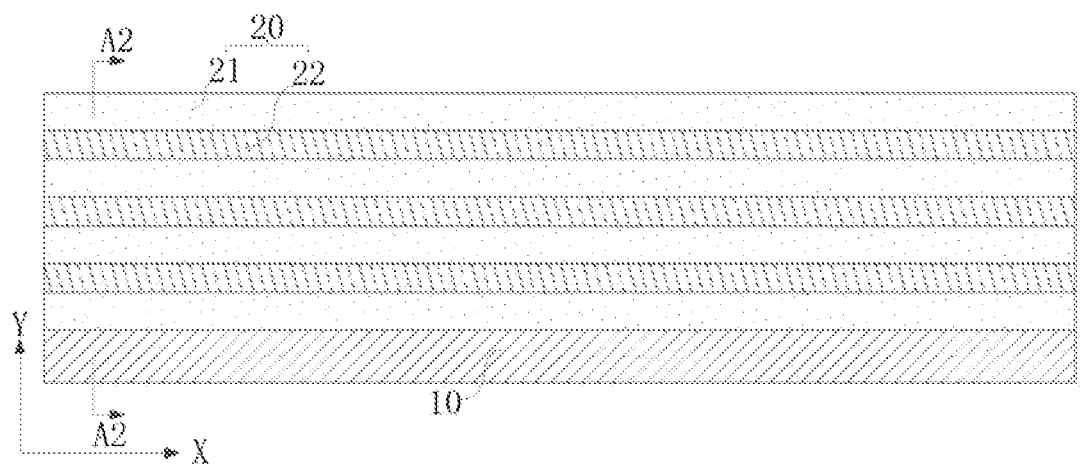
FIG. 4A is a schematic view of forming a first groove in the method for manufacturing a semiconductor structure.
Figure 4B:
FIG. 4B is another schematic view of forming a first groove in the method for manufacturing a semiconductor structure.
Figure 4C:
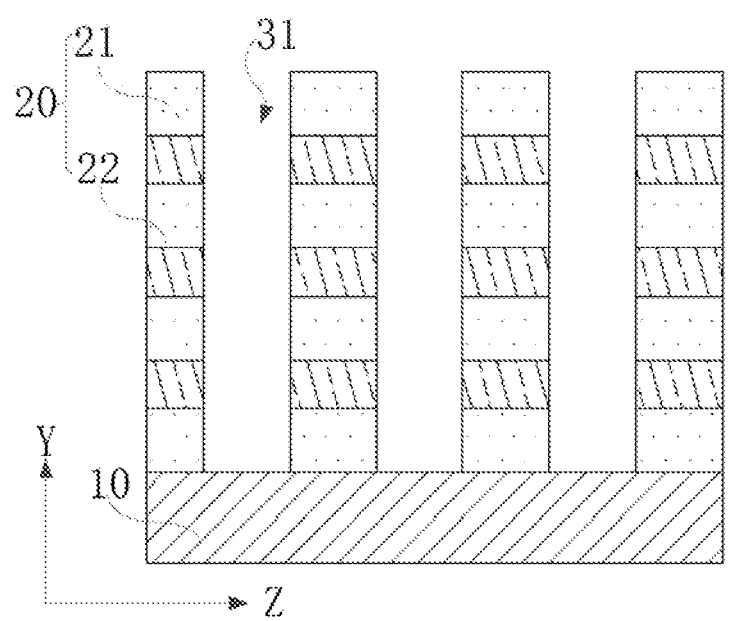
FIG. 4C is a cross-sectional view of A2-A2 in FIG. 4A.

Referring to FIG. 4A, FIG. 4B and FIG. 4C, in this embodiment, after the sacrificial layer 20 is formed, the forming the plurality of first support columns 331 further includes: removing part of the sacrificial layer 20 to form a plurality of first grooves 31. In the Z-axis direction, the plurality of first grooves 31 are disposed above the substrate 10 in parallel and are spaced apart from each other. An extending direction of each the first groove 31 is parallel to the Y-axis direction. In a specific example, part of the sacrificial layer 20 may be etched until the substrate 10 is exposed, so as to form the plurality of first grooves 31.

Figure 5A:
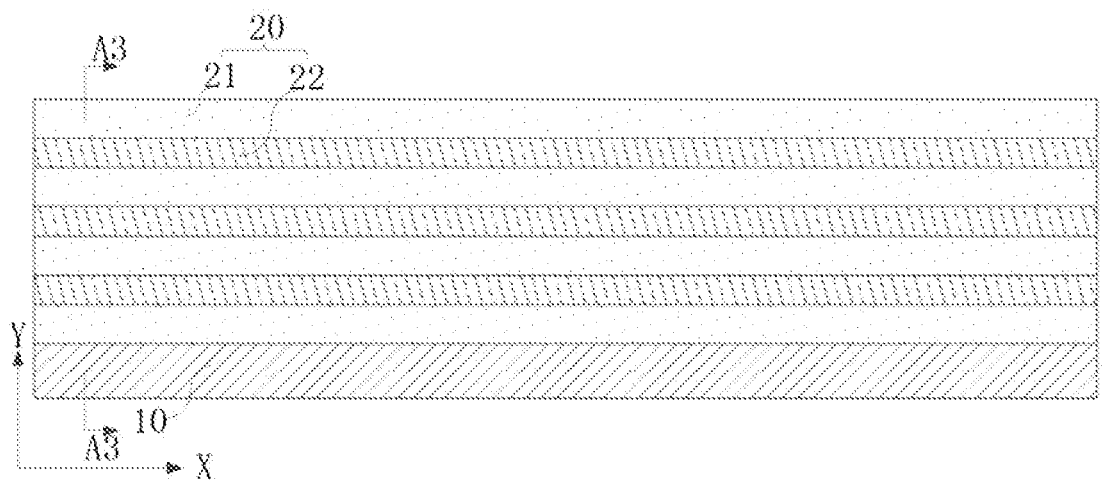
FIG. 5A is a schematic view of forming a filling layer in the method for manufacturing a semiconductor structure.
Figure 5B:
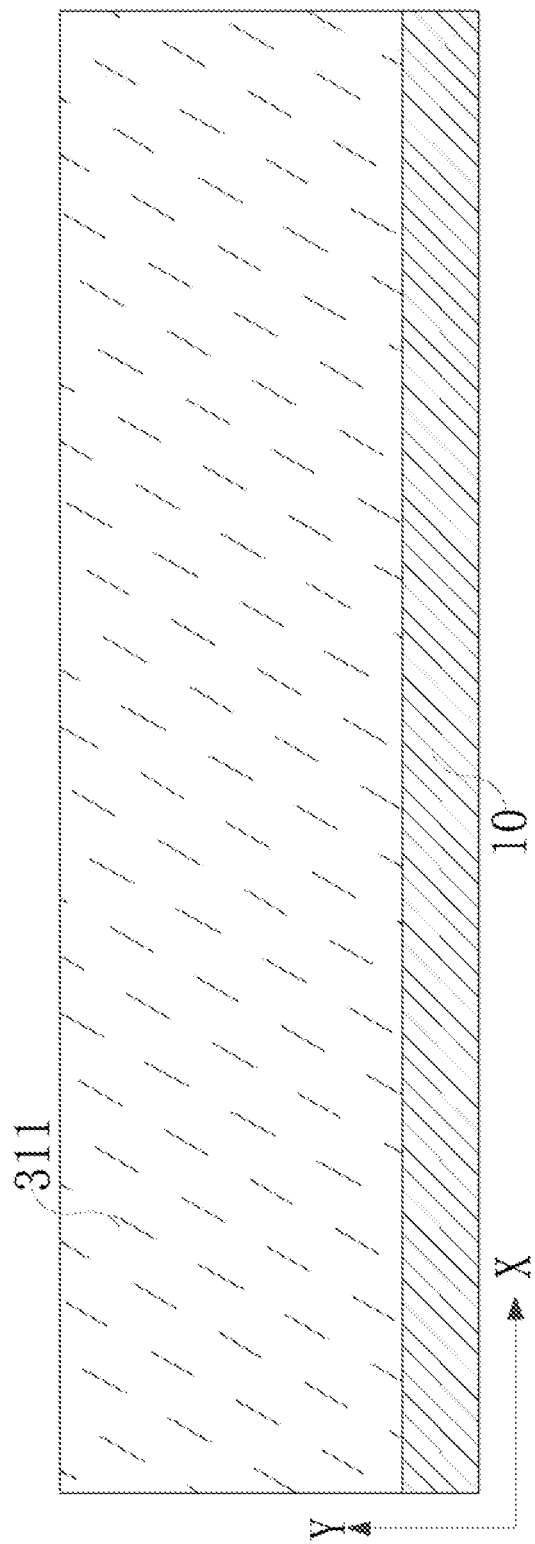
FIG. 5B is another schematic view of forming a filling layer in the method for manufacturing a semiconductor structure.
Figure 5C:
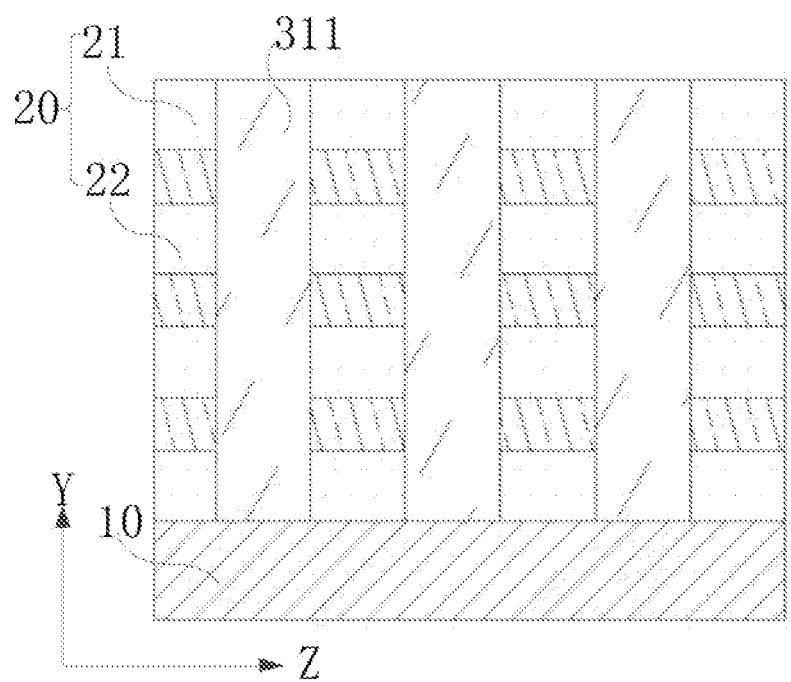
FIG. 5C is a cross-sectional view of A3-A3 in FIG. 5A.

Referring to FIG. 5A, FIG. 5B and FIG. 5C, in this embodiment, after the first grooves 31 are formed, the forming the plurality of first support columns 331 further includes: forming filling layers 311 in the first grooves 31. A material is filled in the first grooves 31, to form the filling layers 311 in the first grooves 31. In the Z-axis direction, the plurality of filling layers 311 are disposed on the substrate 10 in parallel and are spaced apart from each other, and an extending direction of each filling layer 311 is parallel to the Y-axis direction. In some embodiments, the filled material may include polysilicon, single-crystal silicon, and the like.

Figure 6A:
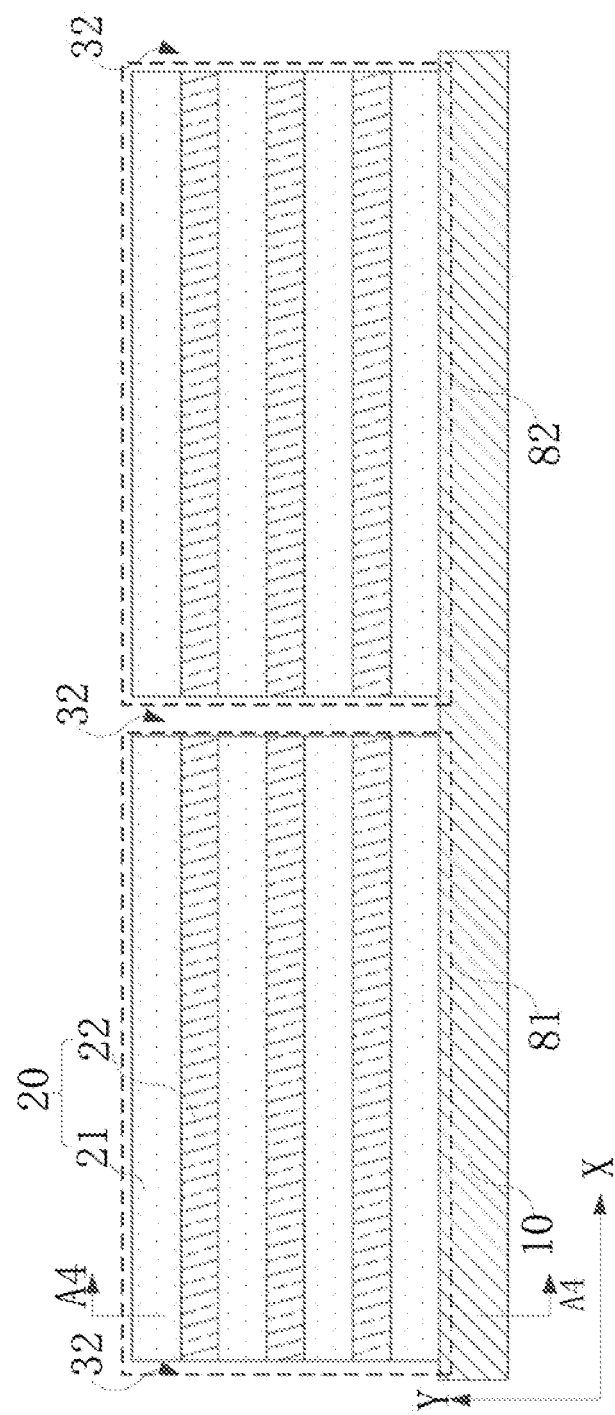
FIG. 6A is a schematic view of forming a second groove in the method for manufacturing a semiconductor structure.
Figure 6B:
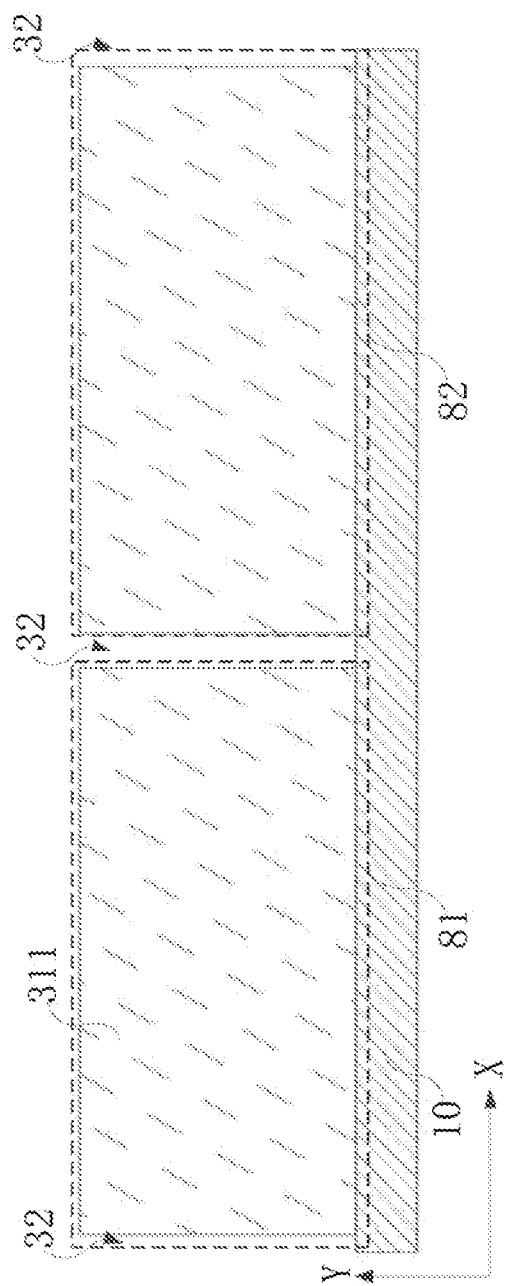
FIG. 6B is another schematic view of forming a second groove in the method for manufacturing a semiconductor structure.

Referring to FIG. 6A and FIG. 6B, in this embodiment, after the filling layers 311 are formed, the forming the plurality of first support columns 331 further includes: removing part of the sacrificial layer 20 and part of the filling layers 311, to form a plurality of second grooves 32. In the X-axis direction, the plurality of second grooves 32 are disposed above the substrate 10 in parallel and are spaced apart from each other, and an extending direction of each second groove 32 is parallel to the first grooves 31. In a specific example, part of the sacrificial layer 20 and part of the filling layers 311 may be etched until the substrate 10 is exposed, so as to form the plurality of second grooves 32. In this embodiment, three second grooves 32 may be formed. The three second grooves 32 divide the sacrificial layer 20 into a first area 81 and a second area 82, so as to further form capacitive structures respectively in the first area 81 and the second area 82 in the subsequent operation.

Figure 7A:
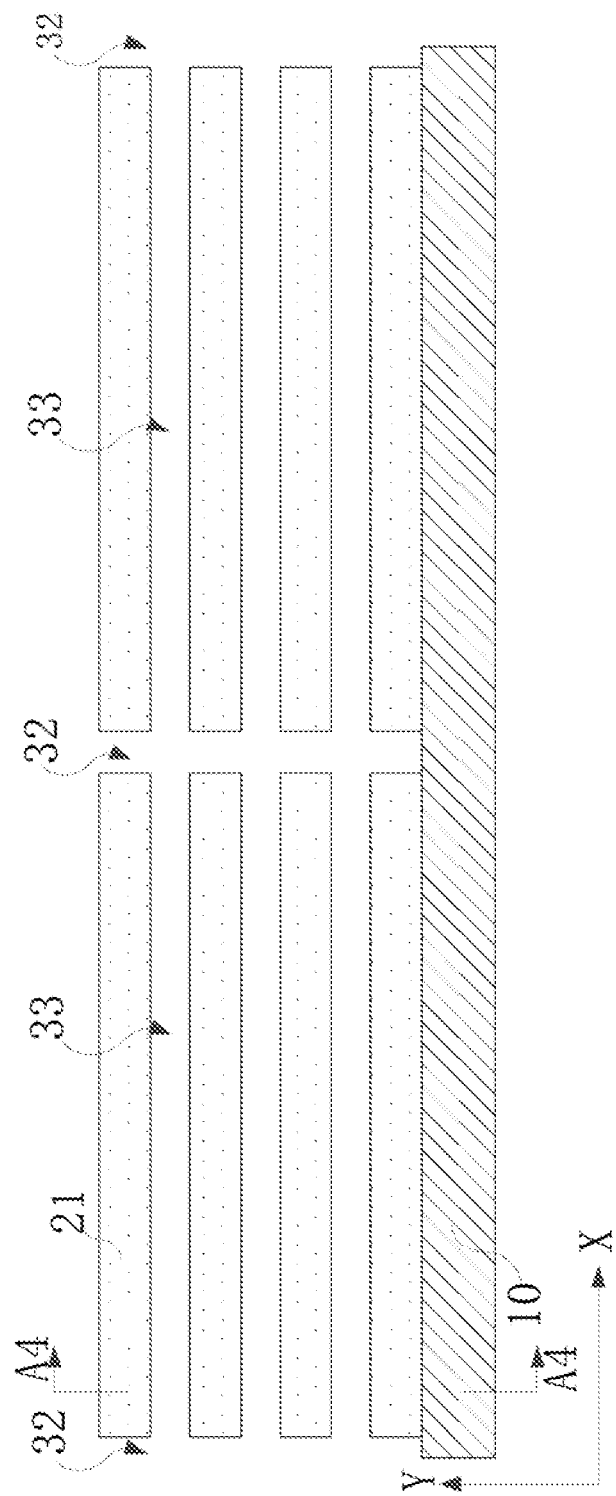
FIG. 7A is a schematic view of forming a filling channel in the method for manufacturing a semiconductor structure.
Figure 7B:
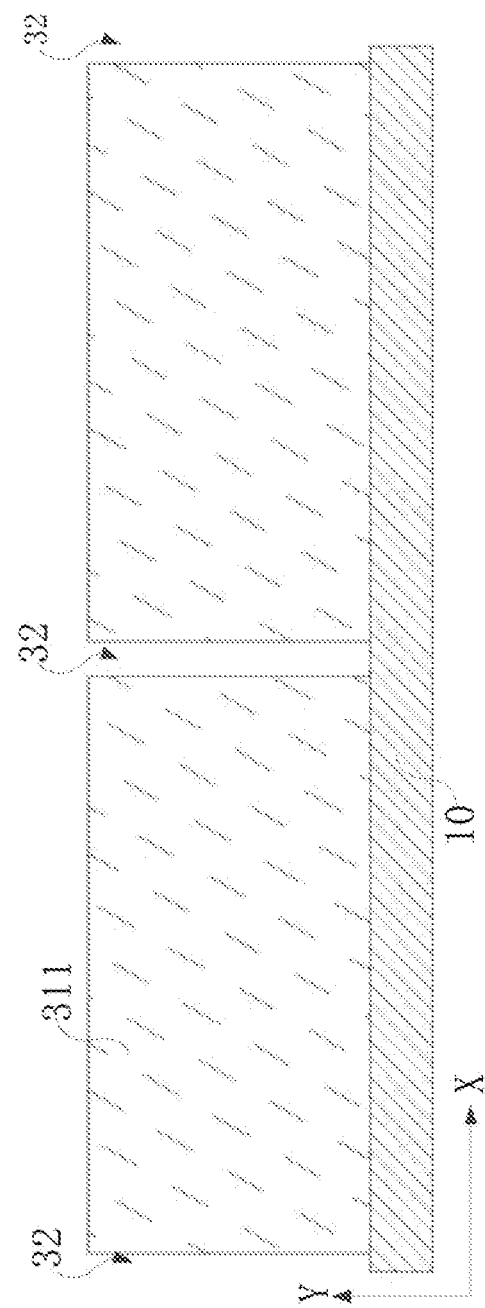
FIG. 7B is another schematic view of forming a filling channel in the method for manufacturing a semiconductor structure.
Figure 7C:
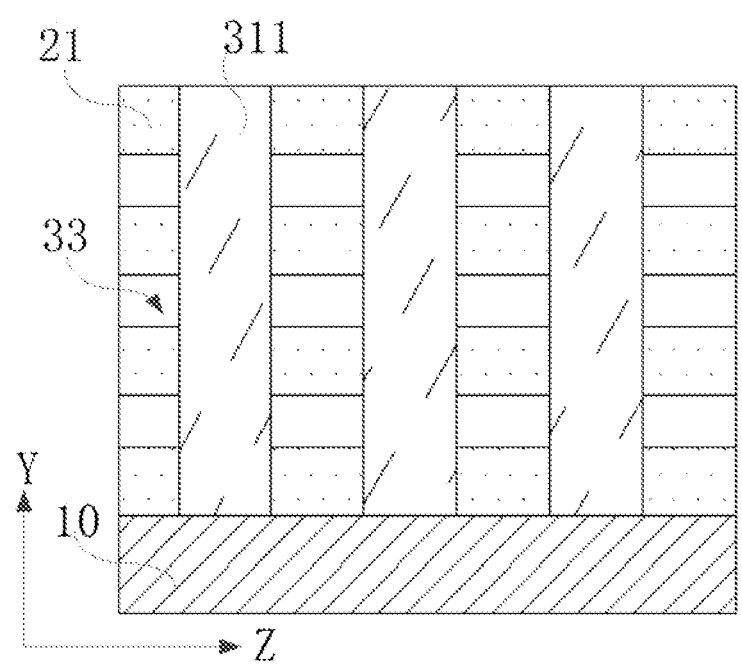
FIG. 7C is a cross-sectional view of A4-A4 in FIG. 7A.

Referring to FIG. 7A, FIG. 7B and FIG. 7C, in this embodiment, after the second grooves 32 are formed, the forming the plurality of first support columns 331 further includes: removing part of the sacrificial layer 20 to form a plurality of filling channels 33. The plurality of filling channels 33 are spaced apart from each other and disposed parallel to the first grooves 31.

In the embodiment where the sacrificial layer 20 only include one first sacrificial layer 21 and one second sacrificial layer 22, in the Z-axis direction, the plurality of filling channels 33 are located in a same plane parallel to the substrate 10. Since the sidewall of the second groove 32 is the sacrificial layer 20, the sacrificial layer 20 may be exposed by the arrangement of the second groove 32. An etch selectivity ratio of the second sacrificial layer 22 is higher than an etch selectivity ratio of the first sacrificial layer 21, so that the second sacrificial layer 22 in the sacrificial layer 20 is removed by etching the sacrificial layer 20 while the first sacrificial layer 21 is retained. Therefore, the plurality of filling channels 33 are formed. In addition, the plurality of filling channels 33 are located between the adjacent second grooves 32, and are in communication with the second grooves 32.

In the Z-axis direction, the plurality of filling channels 33 located in the same plane parallel to the substrate 10 form a filling structure. In the embodiment where the sacrificial layer 20 includes the first sacrificial layer 21 and the second sacrificial layer 22 that are alternately arranged and stacked onto one another, after the second sacrificial layer 22 in the sacrificial layer 20 is removed and the first sacrificial layer 21 is retained, the method further includes: in the direction perpendicular to the substrate 10 (that is, in the Y-axis direction), forming the filling structures stacked on the substrate 10. Each filling structure includes the plurality of filling channels 33 that are arranged in parallel and spaced apart from each other.

Figure 8A:
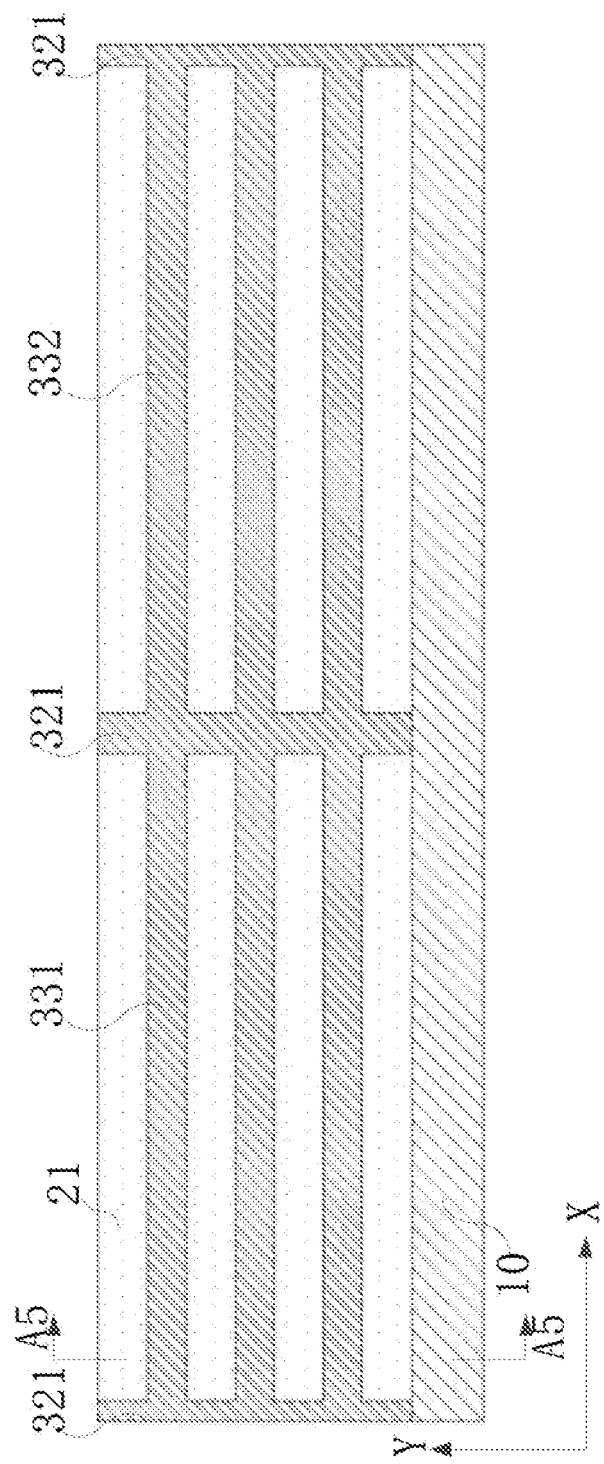
FIG. 8A is a schematic view of forming a first support column in the method for manufacturing a semiconductor structure.
Figure 8B:
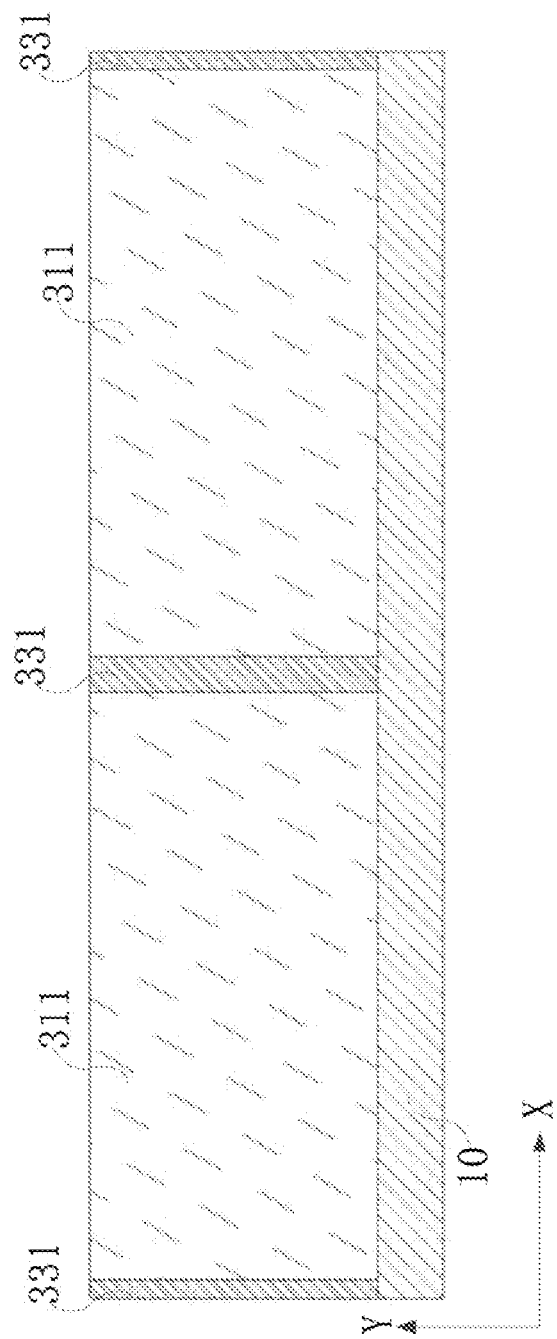
FIG. 8B is another schematic view of forming a first support column in the method for manufacturing a semiconductor structure.
Figure 8C:
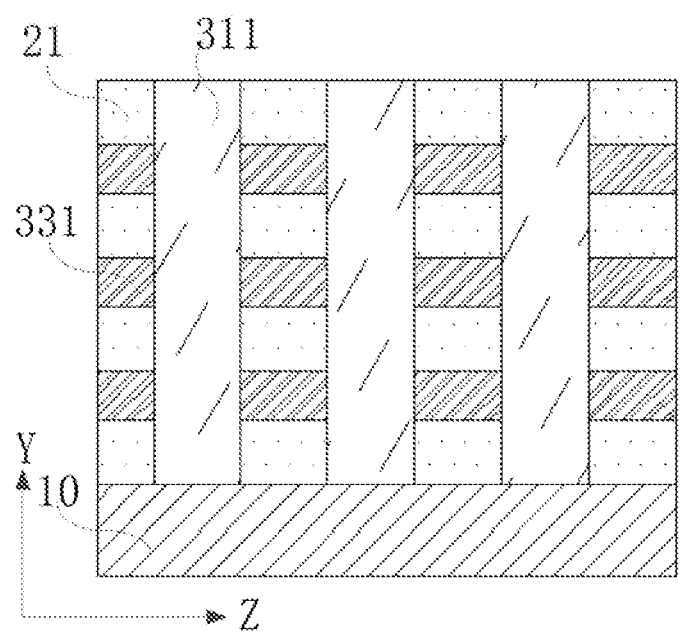
FIG. 8C is a cross-sectional view of A5-A5 in FIG. 8A.

Referring to FIG. 8A, FIG. 8B and FIG. 5C, in this embodiment, after the filling channels 33 are formed, the forming the plurality of first support columns 331 further includes: forming the first support columns 331 in the filling channels 33. In some embodiments, the first support columns 331 may be formed in the filling channels 33 by means of a deposition process. A material of each first support column 331 includes single-crystal silicon, single-crystal germanium, single-crystal silicon germanium or IGZO, so that the first support columns 331 are sufficient to support the first capacitive structure 41. The IGZO is an amorphous oxide containing indium, gallium and zinc, which has desirable carrier migration performance. In this embodiment, the material of the first support columns 331 may be IGZO, so that the performance of the first capacitive structure 41 is improved.

Continuously referring to FIG. 8A and FIG. 8B, after the first support columns 331 are formed in the filling channels 33, the method further includes: forming intermediate support layers 321 in the second grooves 32. Since the filling channels 33 is in communication with the second grooves 32, the intermediate support layers 321 may be formed in the second grooves 32 by means of the deposition process while the first support columns 331 are formed. In this embodiment, the intermediate support layers 321 have the same material as the first support columns 331, and the intermediate support layers 321 are bonded to the first support columns 331.

Referring to FIG. 9A to FIG. 11A, after the first support columns 331 are formed, the method further includes the following operations.

Figure 9A:
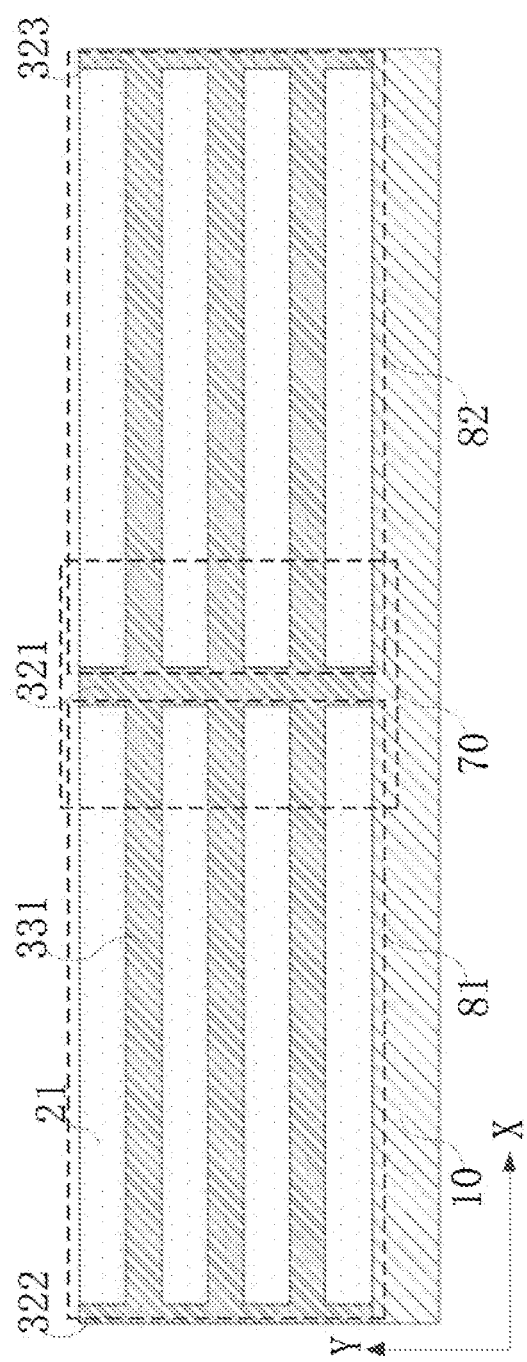
FIG. 9A is a schematic view of forming a third groove in the method for manufacturing a semiconductor structure.
Figure 9B:
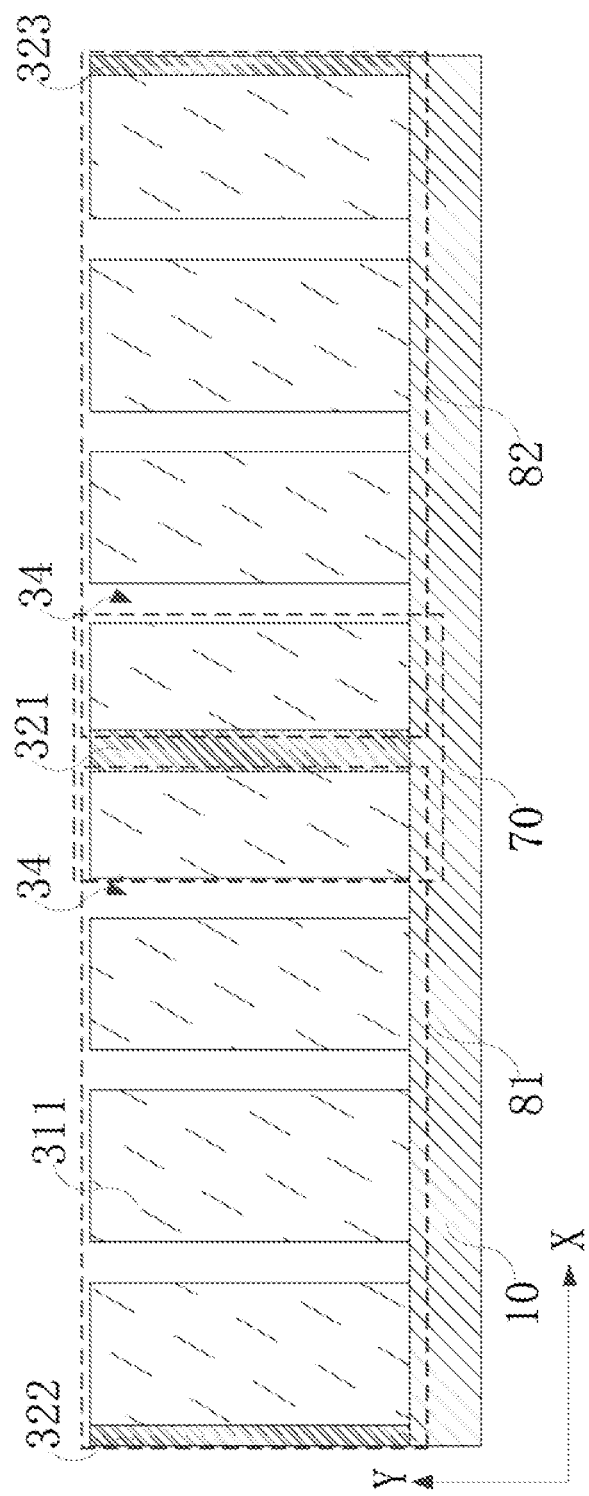
FIG. 9B is another schematic view of forming a third groove in the method for manufacturing a semiconductor structure.

Referring to FIG. 9A and FIG. 9B, in this embodiment, after the first support columns 331 are formed, the method further includes: removing part of the filling layers 311 to form a plurality of third grooves 34. The plurality of third grooves 34 are disposed on the substrate 10 in parallel and are spaced apart from each other, and an extending direction of each third groove 34 is perpendicular to the first grooves 31. In a specific example, part of the filling layers 311 may be etched until the substrate 10 is exposed, so as to form the plurality of third grooves 34. Compared FIG. 6B with FIG. 9B, the third grooves 34 further divide the sacrificial layer 20 in the first area 81 into a plurality of areas, so as to form a plurality of capacitors in the plurality of areas in the subsequent operation.

Figure 10A:
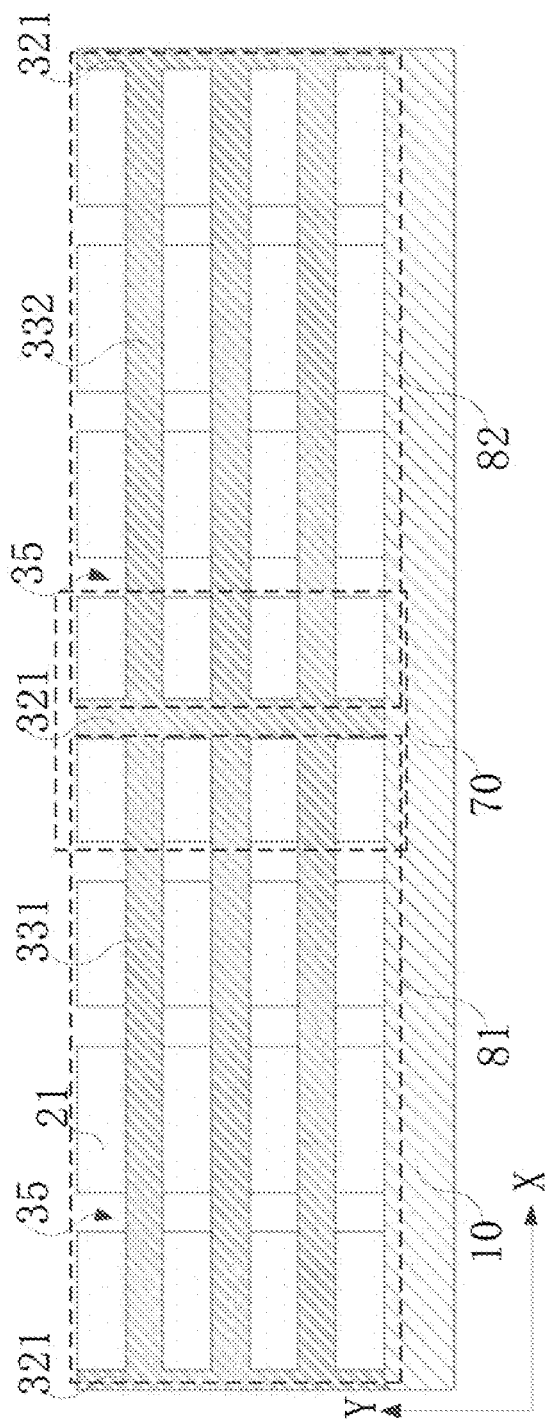
FIG. 10A is a schematic view of forming a filling sidewall in the method for manufacturing a semiconductor structure.
Figure 10B:
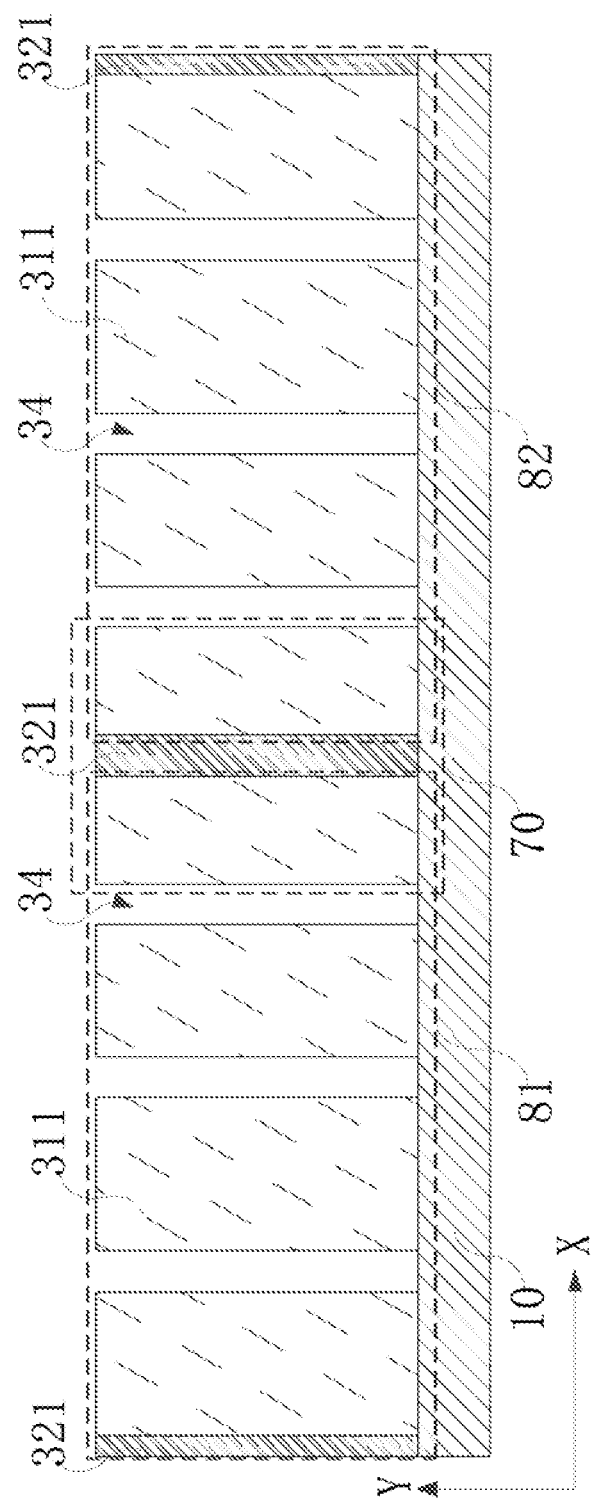
FIG. 10B is another schematic view of forming a filling sidewall in the method for manufacturing a semiconductor structure.

Referring to FIG. 10A and FIG. 10B, in this embodiment, after the third grooves 34 are formed, the method further includes: removing a part of the sacrificial layer 20 corresponding to sidewalls of the third grooves 34 with the first support columns 331 being retained, to form filling sidewalls 35. The removing of the part of the sacrificial layer 20 corresponding to the sidewalls of the third grooves 34 means that a part of the first sacrificial layer 21 corresponding to the sidewalls of the third grooves 34 is removed, and the first support columns 331 are retained. In a specific example, the etch selectivity ratio of the first sacrificial layer 21 is greater than the etch selectivity ratio of the first support column 331. Then, the first sacrificial layer 21 is removed by means of an etching process, and the first support column 331 is retained.

Figure 11A:
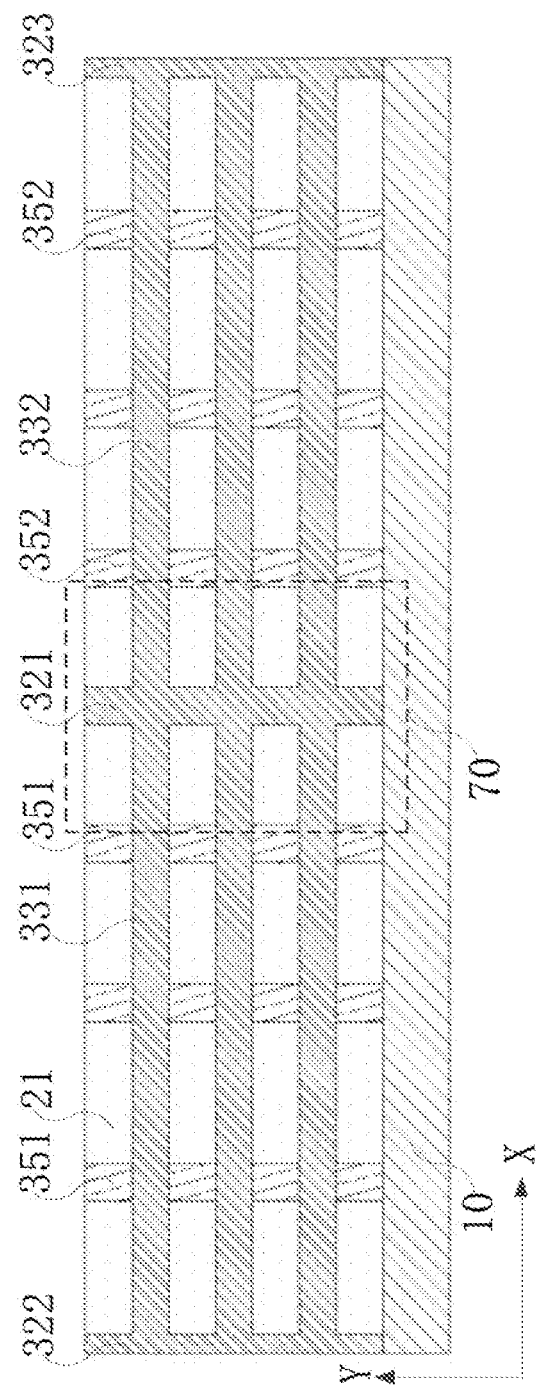
FIG. 11B is another schematic view of forming a first support layer in the method for manufacturing a semiconductor structure.
Figure 11B:
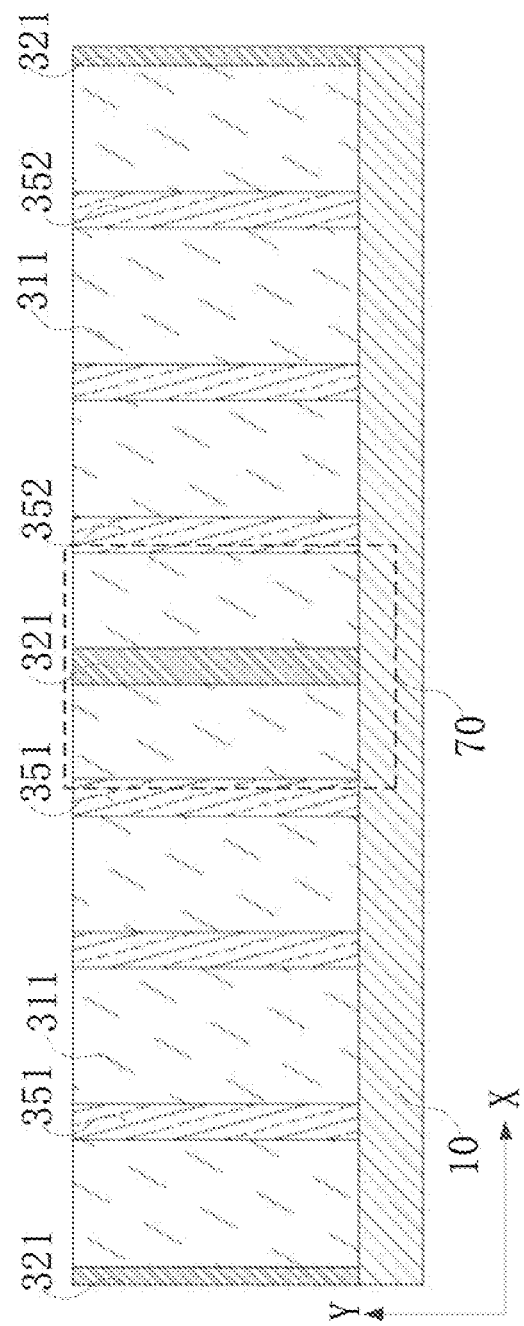

Referring to FIG. 11A and FIG. 11B, in this embodiment, after the filling sidewalls 35 are formed, the method further includes: forming first support layers 351 in part of the filling sidewalls 35. The first support layers 351 surround the sidewall surfaces of the first support columns 331. For example, the first support layers 351 may be formed in the filling sidewalls 35 by means of the deposition process. A material of the first support layers 351 may, for example, include nitride. Through the arrangement of the first support layers 351, the first support columns 331 may be further supported.

Referring to FIG. 12A to FIG. 15B below, after the first support layers 351 are formed, the method further includes the follows.

At S103, a first capacitive structure is formed. The first capacitive structure includes a first lower electrode layer, a first dielectric layer and a first upper electrode layer. The first lower electrode layer covers sidewall surfaces of the first support columns and the substrate. The first dielectric layer covers the first lower electrode layer. The first upper electrode layer covers the first dielectric layer.

Figure 12A:
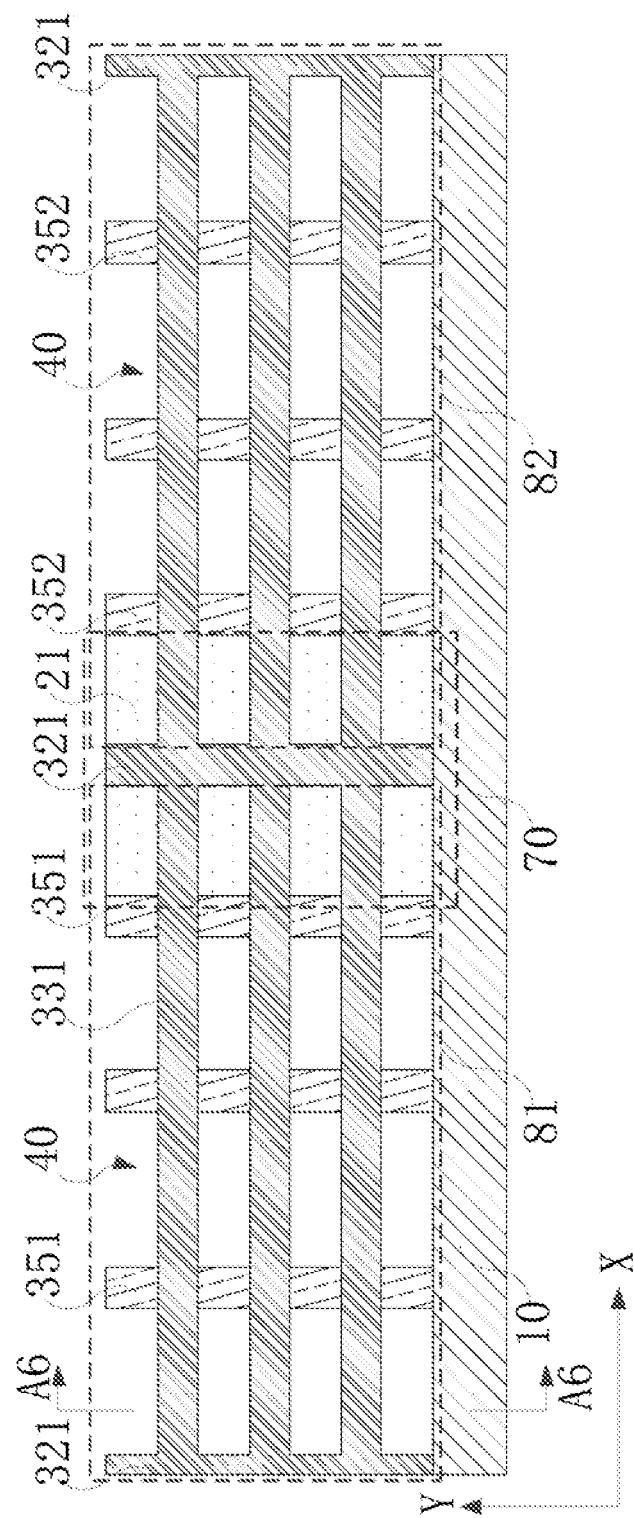
FIG. 12A is a schematic view of removing part of a sacrificial layer and a filling layer in the method for manufacturing a semiconductor structure.
Figure 12B:
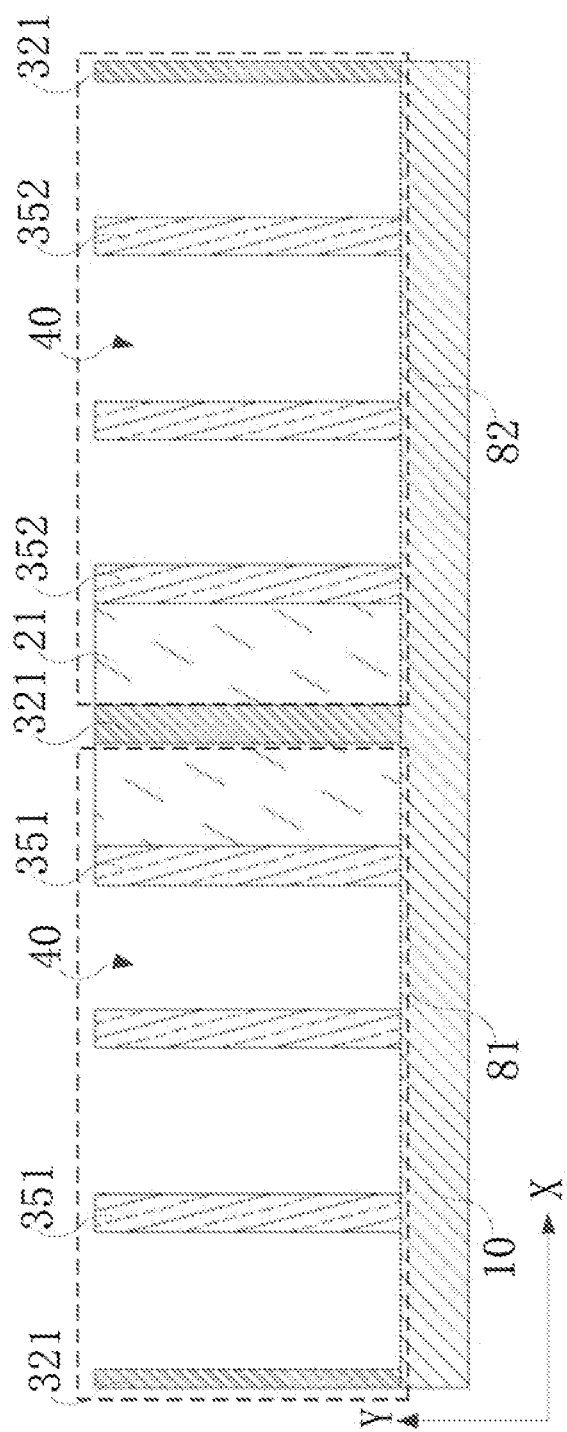
FIG. 12B is another schematic view of removing part of a sacrificial layer and a filling layer in the method for manufacturing a semiconductor structure.
Figure 12C:
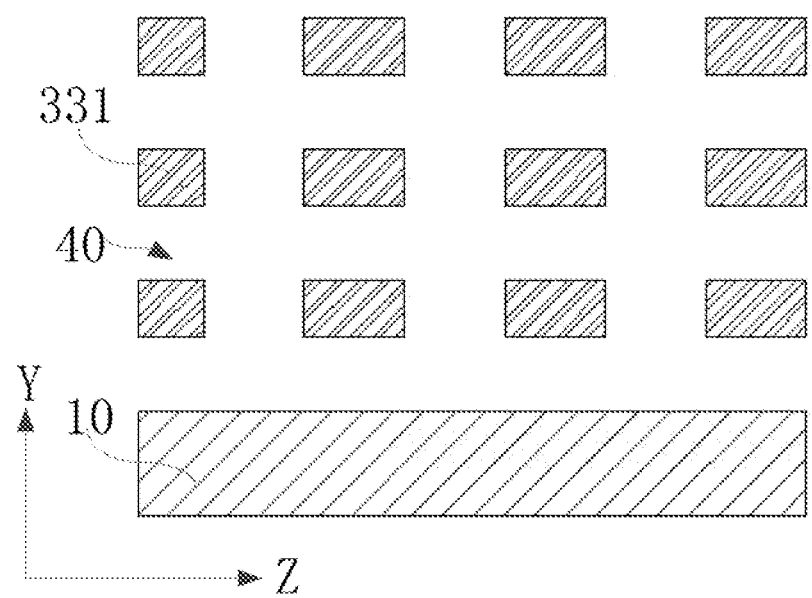
FIG. 12C is a cross-sectional view of A6-A6 in FIG. 12A.

Referring to FIG. 12A, FIG. 12B and FIG. 12C, in this embodiment, the forming the first capacitive structure 41 includes: removing part of the sacrificial layer 20 and the filling layers 311 to retain the first support columns 331 and the first support layers 351. In this embodiment, part of the first sacrificial layer 21 and the filling layers 311 in the first area 81 are removed to retain the first support columns 331 and the first support layers 351, so that filling space is formed to form a capacitor in the filling space in the subsequent operation. In a specific example, the etch selectivity ratios of the first sacrificial layer 21 and the filling layer 311 are greater than the etch selectivity ratios of the first support column 331 and the first support layer 351. Then, the sacrificial layer 20 and the filling layer 311 are removed by means of the etching process, to retain the first support column 331 and the first support layer 351.

Figure 13A:
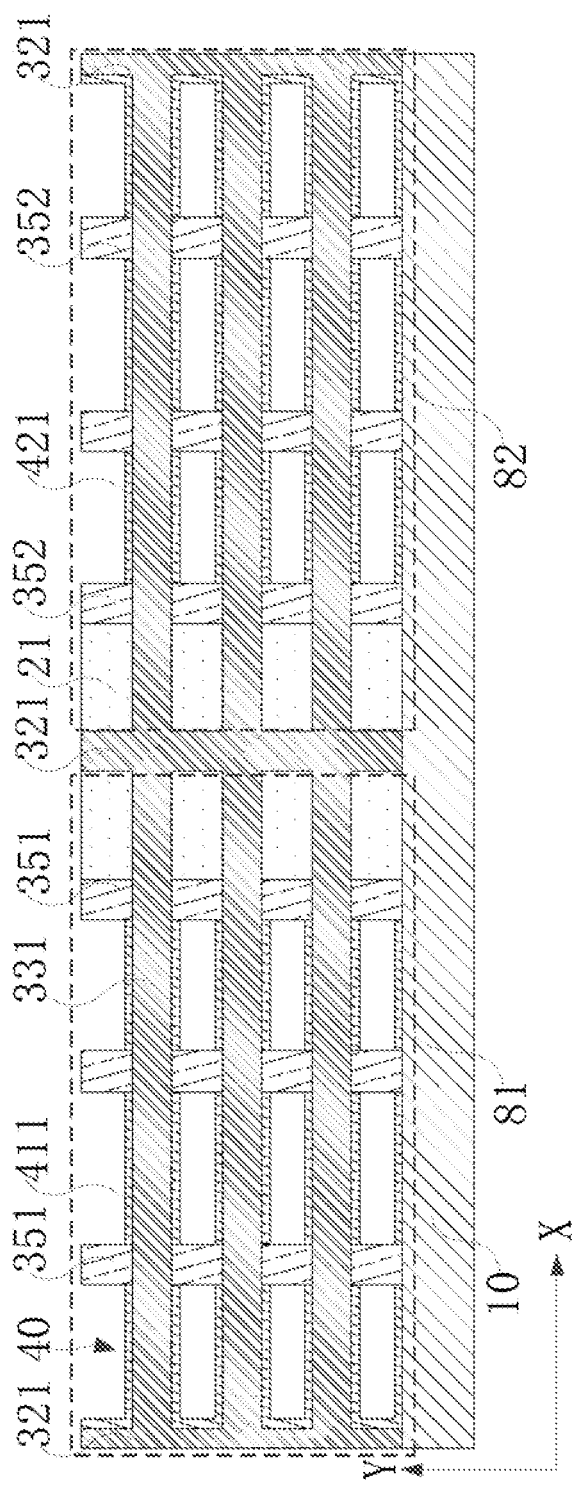
FIG. 13A is a schematic view of forming a first lower electrode layer in the method for manufacturing a semiconductor structure.
Figure 13B:
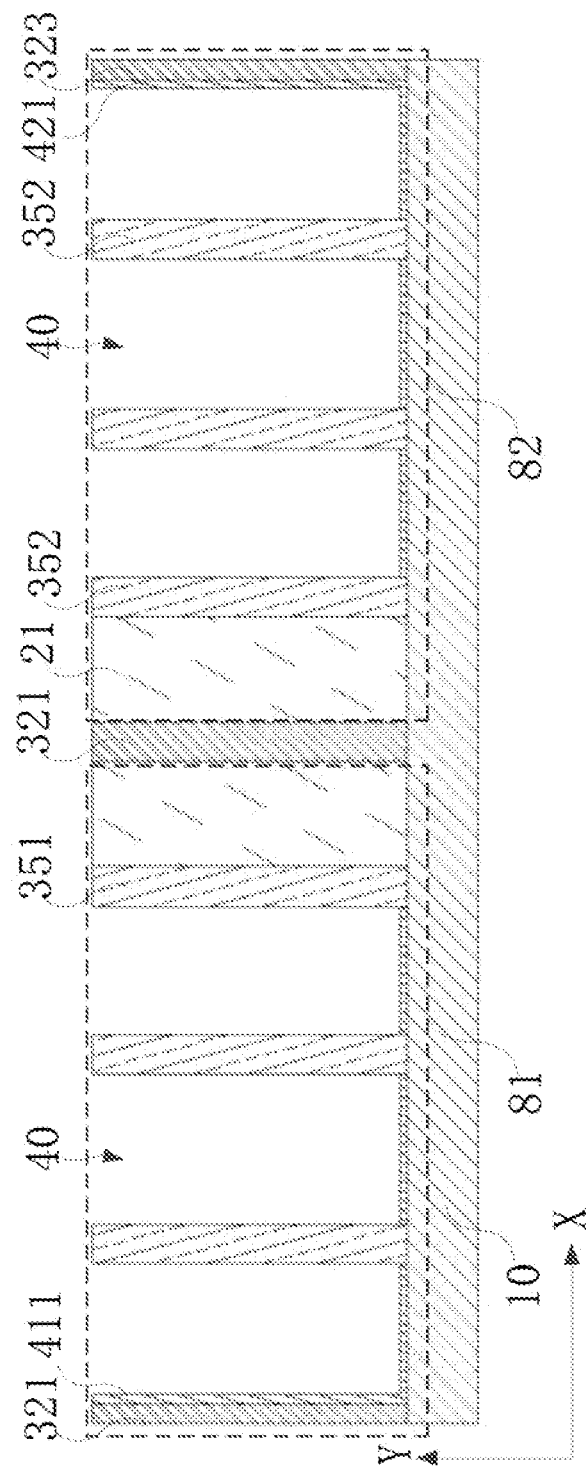
FIG. 13B is another schematic view of forming a first lower electrode layer in the method for manufacturing a semiconductor structure.

Referring to FIG. 13A and FIG. 13B, in this embodiment, after part of the sacrificial layer 20 and the filling layer 311 are removed, the method further includes: forming first lower electrode layers 411 on the first support column 331 in the filling space and the substrate 10 by means of a selective growth process. It is to be noted that, the selective growth process may selectively deposit a material on a surface of a required material. For example, a material of the first lower electrode layers 411 may include metal materials such as tungsten and titanium. During deposition, the first lower electrode layers are selectively deposited on the sidewall of the first support column 331 and the surface of the substrate 10, without depositing on the sidewall of the first support layer 351. By means of the selective growth process, the operation of removing the first lower electrode layer 411 on the sidewall of the first support layer 351 can be omitted, so that manufacturing efficiency can be enhanced.

Continuously referring to FIG. 13A and FIG. 13B, in this embodiment, since the intermediate support layer 321 has the same material as the first support column 331, the first lower electrode layer 411 also covers the intermediate support layer 321 on the side of the filling space.

Figure 14A:
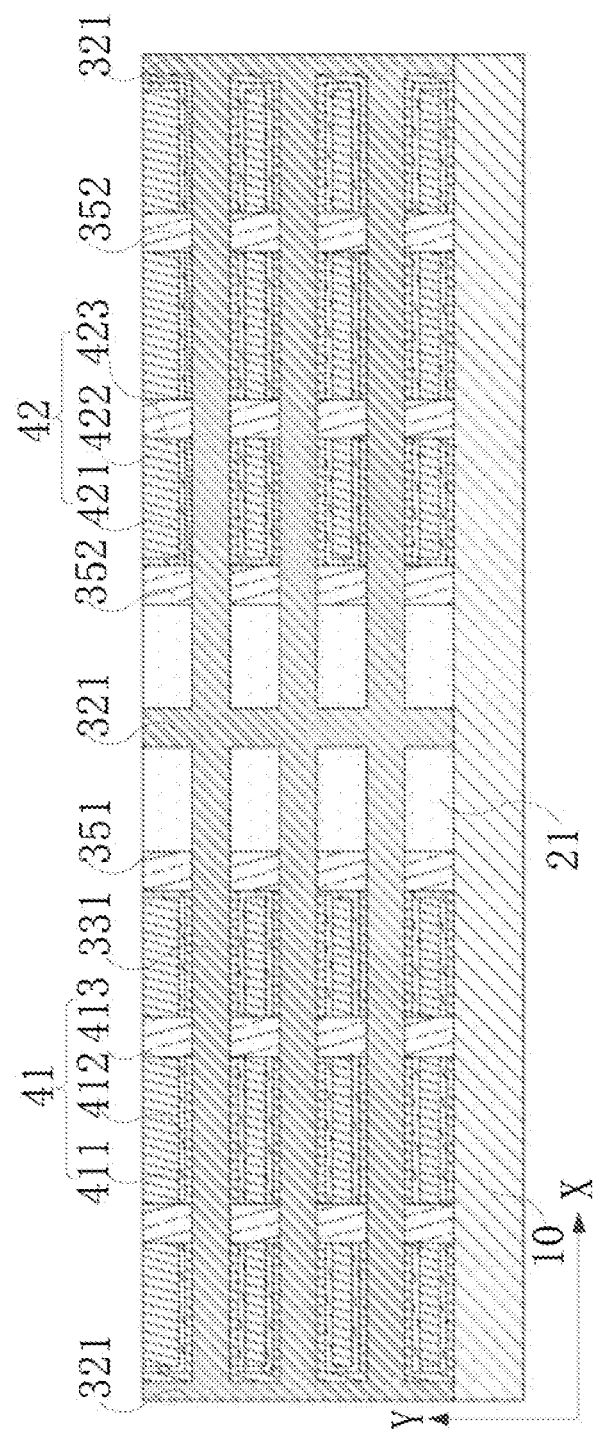
FIG. 14A is a schematic view of forming a first dielectric layer and a first upper electrode layer in the method for manufacturing a semiconductor structure.
Figure 14B:
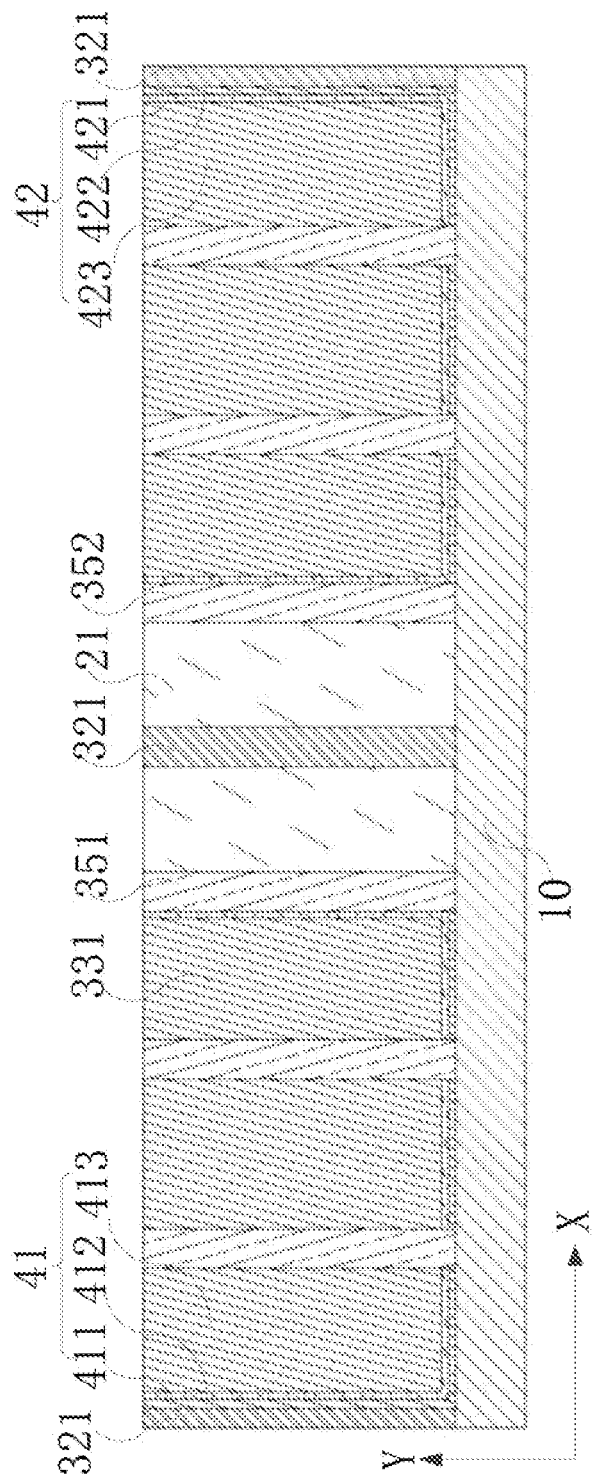
FIG. 14B is another schematic view of forming a first dielectric layer and a first upper electrode layer in the method for manufacturing a semiconductor structure.

Referring to FIG. 14A and FIG. 14B, in this embodiment, after the first lower electrode layer 411 is formed, the method further includes: successively forming a first dielectric layer 412 and a first upper electrode layer 413. In a specific example, the first dielectric layer 412 and the first upper electrode layer 413 may be successively formed by means of the deposition process. A material of the first dielectric layer 412 may include a material having a high dielectric constant, silicon oxide, silicon nitride or silicon oxynitride, to achieve an insulation effect between the first upper electrode layer 413 and the first lower electrode layer 411. A material of the first upper electrode layer 413 may include metal materials such as tungsten and titanium. In this embodiment, the first upper electrode layer 413 has the same material as the first lower electrode layer 411.

Continuously referring to FIG. 14A and FIG. 14B, in the embodiment that the sacrificial layer 20 includes the first sacrificial layer 21 and the second sacrificial layer 22 that are alternately arranged and stacked onto one another, the forming the first capacitive structure 41 further includes the following. The first capacitive structure 41 and the first support column 331 form the first capacitive assembly 61. In the direction perpendicular to the substrate 10 (that is, in the Y-axis direction), a plurality of first capacitive assemblies 61 arranged in stack are formed. When the first lower electrode layer 411, the first dielectric layer 412 and the first upper electrode layer 413 are successively deposited and formed, the plurality of first capacitive assemblies 61 are synchronously formed.

The corresponding first upper electrode layers 413 of the adjacent first capacitive assemblies 61 are electrically connected to each other. For example, in the Y-axis direction, the corresponding first upper electrode layers 413 of the adjacent first capacitive assemblies 61 may be connected to each other by means of a conductive layer. A material of the conductive layer may be, for example, metal or metal alloy. As shown in FIG. 14A, in the direction perpendicular to the substrate 10 (that is, in the Y-axis direction), the corresponding first upper electrode layers 413 of the adjacent first capacitive assemblies 61 may directly be bonded together, to cause the adjacent first capacitive assemblies 61 to share the same first upper electrode layer 413.

Figure 15A:
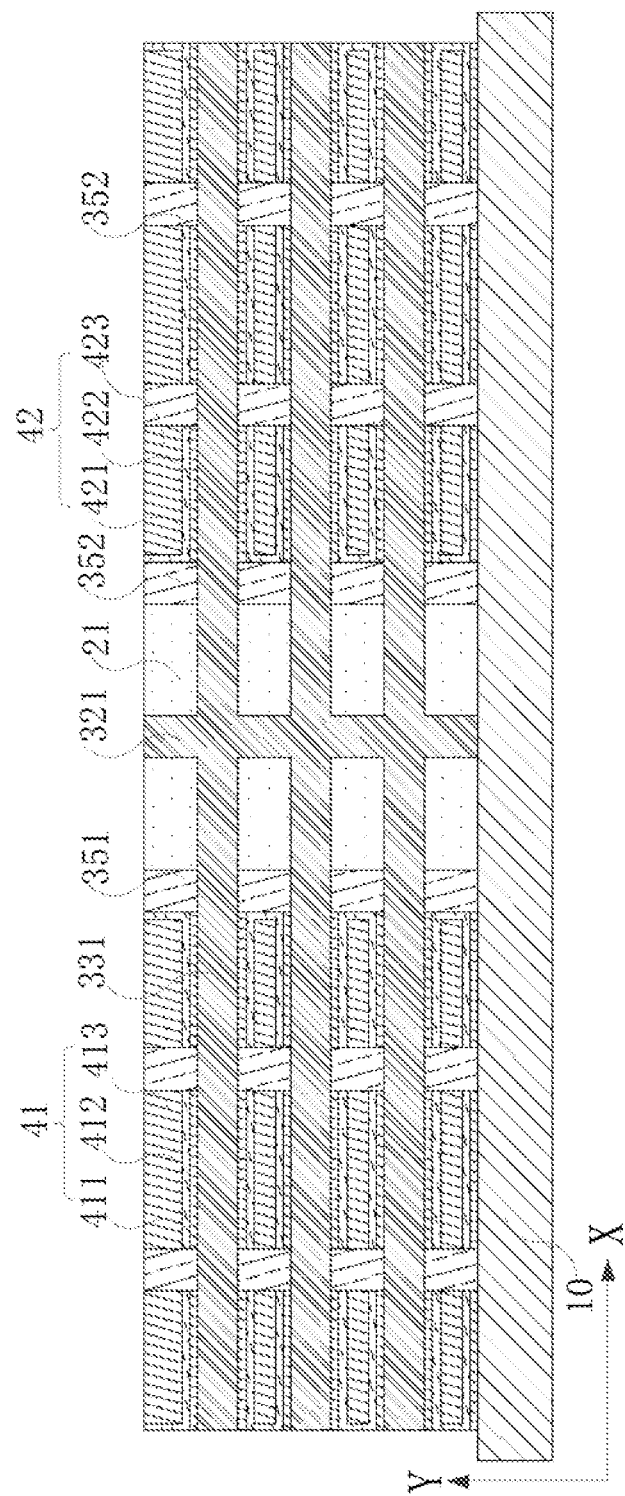
FIG. 15A is a schematic view of removing part of an intermediate support layer in the method for manufacturing a semiconductor structure.
Figure 15B:
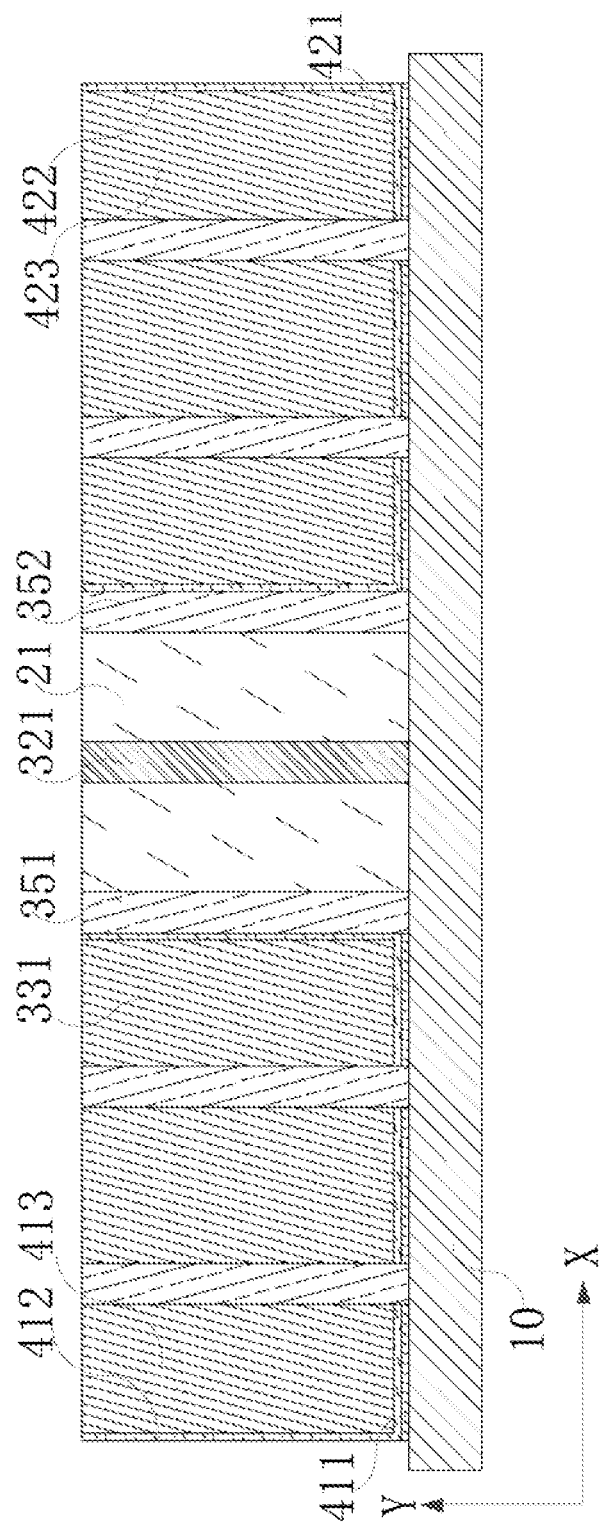
FIG. 15B is another schematic view of removing part of an intermediate support layer in the method for manufacturing a semiconductor structure.
Figure 16A:
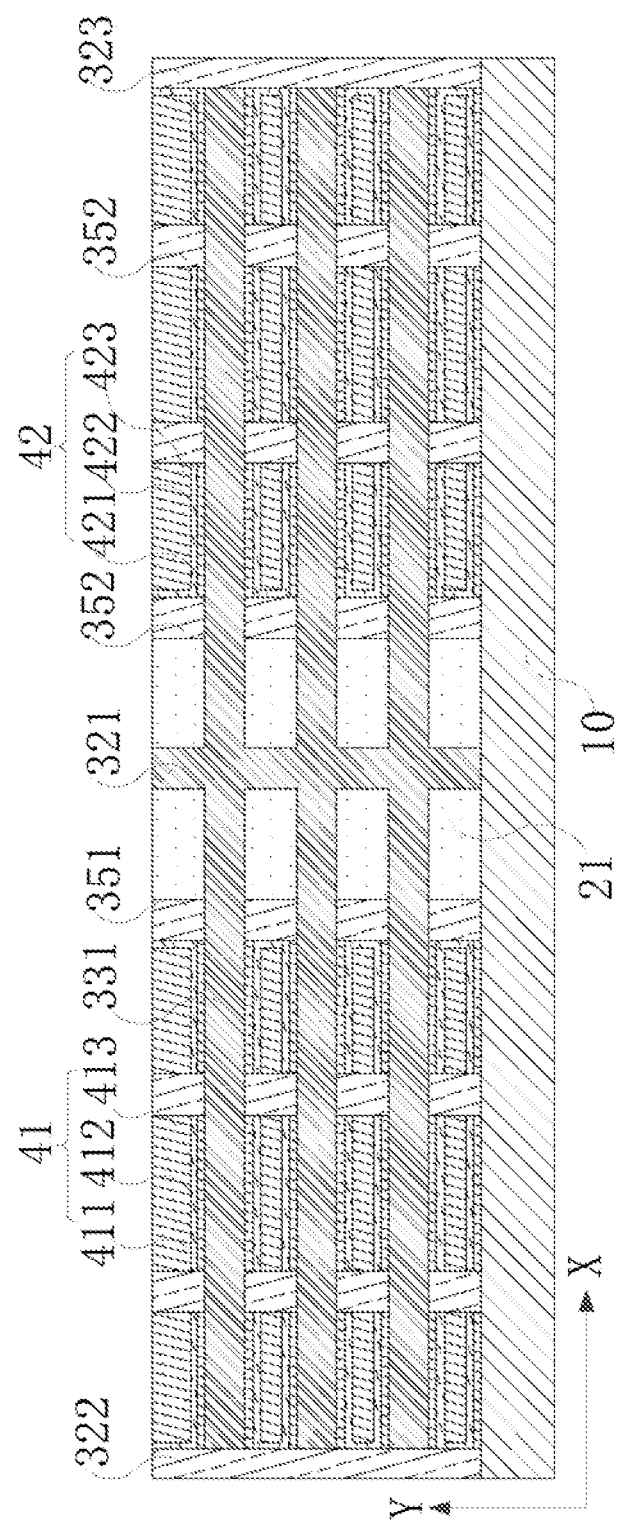
FIG. 16A is a schematic view of forming a second support layer in the method for manufacturing a semiconductor structure.
Figure 16B:
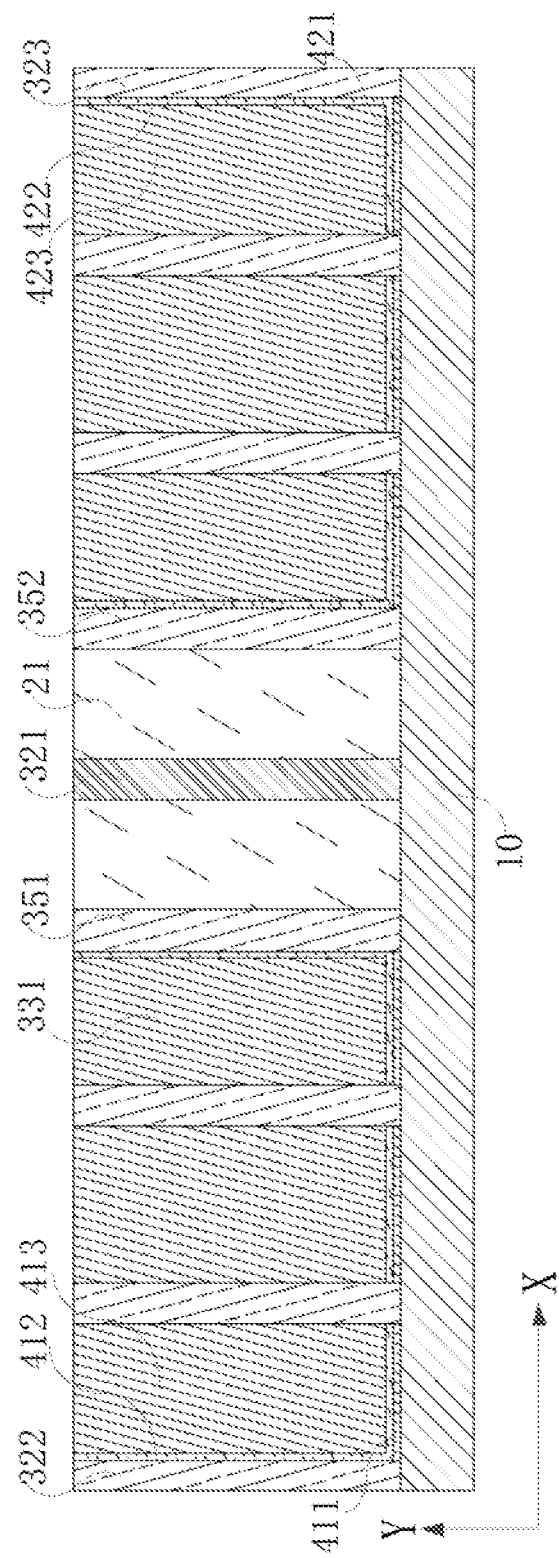
FIG. 16B is another schematic view of forming a second support layer in the method for manufacturing a semiconductor structure.

Referring to FIG. 15A and FIG. 15B, the forming the first capacitive structure 41 further includes: removing part of the intermediate support layer 321 after the first dielectric layer 412 and the first upper electrode layer 413 are successively formed. Referring to FIG. 16A and FIG. 16B, after part of the intermediate support layer 321 is removed, second support layers 322 are formed in part of the second grooves 32. For example, the intermediate support layer 321 on the left side of the first capacitive structure 41 may be removed to form the second groove 32, and then the second support layer 322 is formed in the second groove 32. Through the arrangement of the second support layer 322, the first support column 331 can be further supported. In a specific example, a material of the second support layer 322 may include nitride. In this embodiment, the second support layer 322 may have the same material as the first support layer 351.

Compared FIG. 14A with FIG. 15A, while part of the intermediate support layer 321 is removed, the first lower electrode layer 411 covering the sidewall of the intermediate support layer 321 is also removed, so that, the adjacent capacitors are isolated from one another in the direction perpendicular to the substrate 10 (in the Y-axis direction).

Figure 17A:
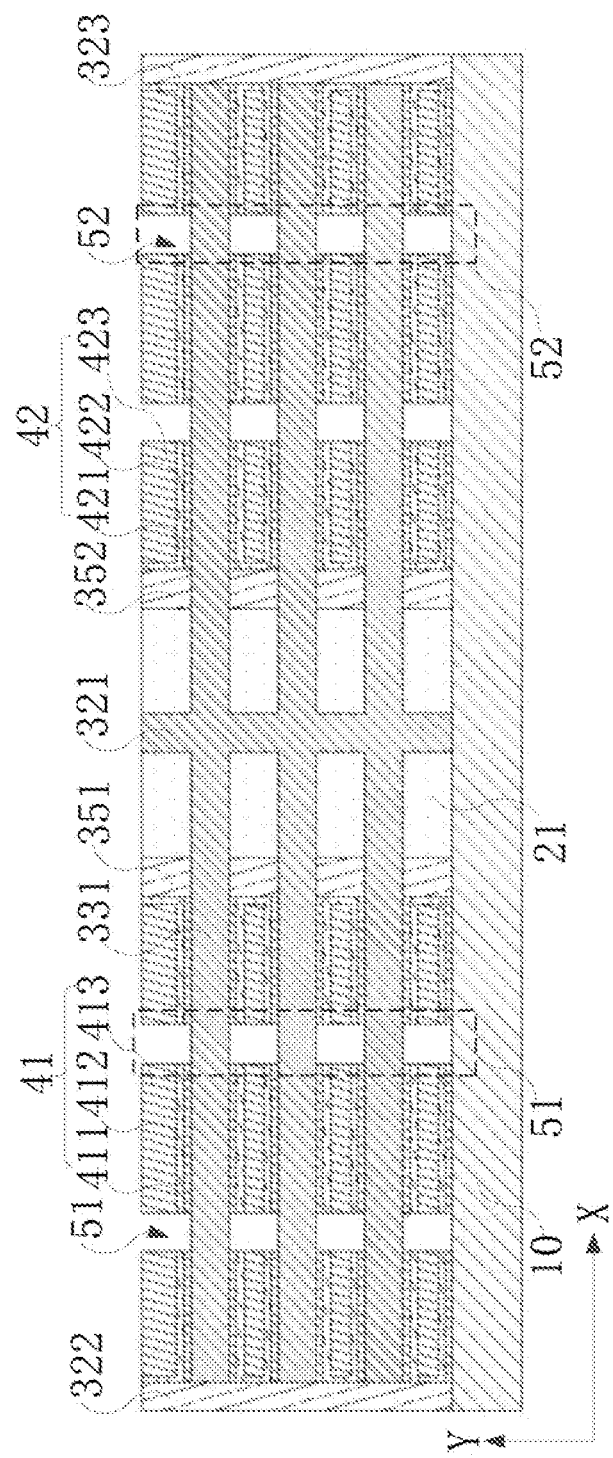
FIG. 17A is a schematic view of forming a first segmentation trench in the method for manufacturing a semiconductor structure.
Figure 17B:
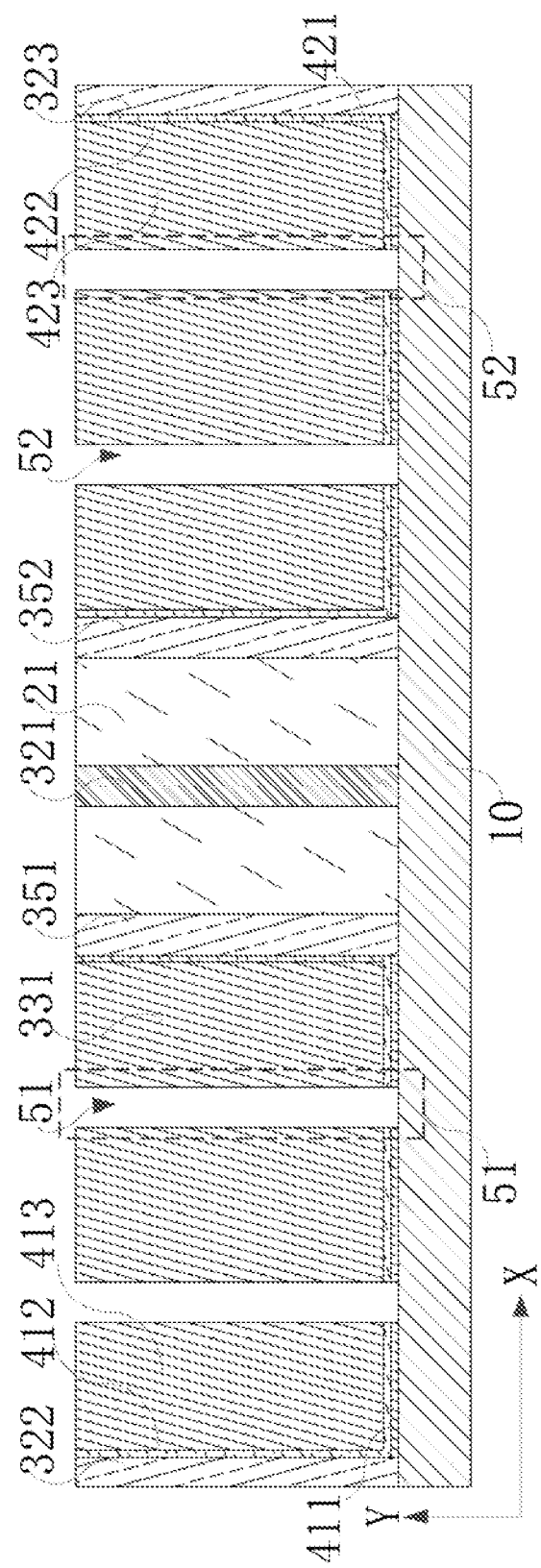
FIG. 17B is another schematic view of forming a first segmentation trench in the method for manufacturing a semiconductor structure.

Referring to FIG. 17A to FIG. 17B below, after the plurality of first capacitive structures 41 are formed, the method further includes the follows.

At S104, a plurality of first segmentation trenches are formed. The plurality of first segmentation trenches are disposed on the substrate in parallel and are spaced apart from each other. An extending direction of the first segmentation trenches is perpendicular to the first support columns. The first segmentation trenches divide the first capacitive structure into a plurality of capacitors.

Part of the first support layer 351 is removed to form a first segmentation trench 51. For example, the first support layer 351 between the adjacent capacitors may be removed, to expose the corresponding first support column 331 in the first segmentation trench 51 and to expose the substrate 10. In a specific example, the etch selectivity ratio of the first support layer 351 is greater than the etch selectivity ratio of the first support column 331. Then, the first support layer 351 is removed by means of the etching process, and the first support column 331 is retained.

It is to be noted that, through the arrangement of the plurality of first segmentation trenches 51, the first capacitive structures 41 distributed in the X-axis direction are divided into the plurality of capacitors.

Figure 18A:
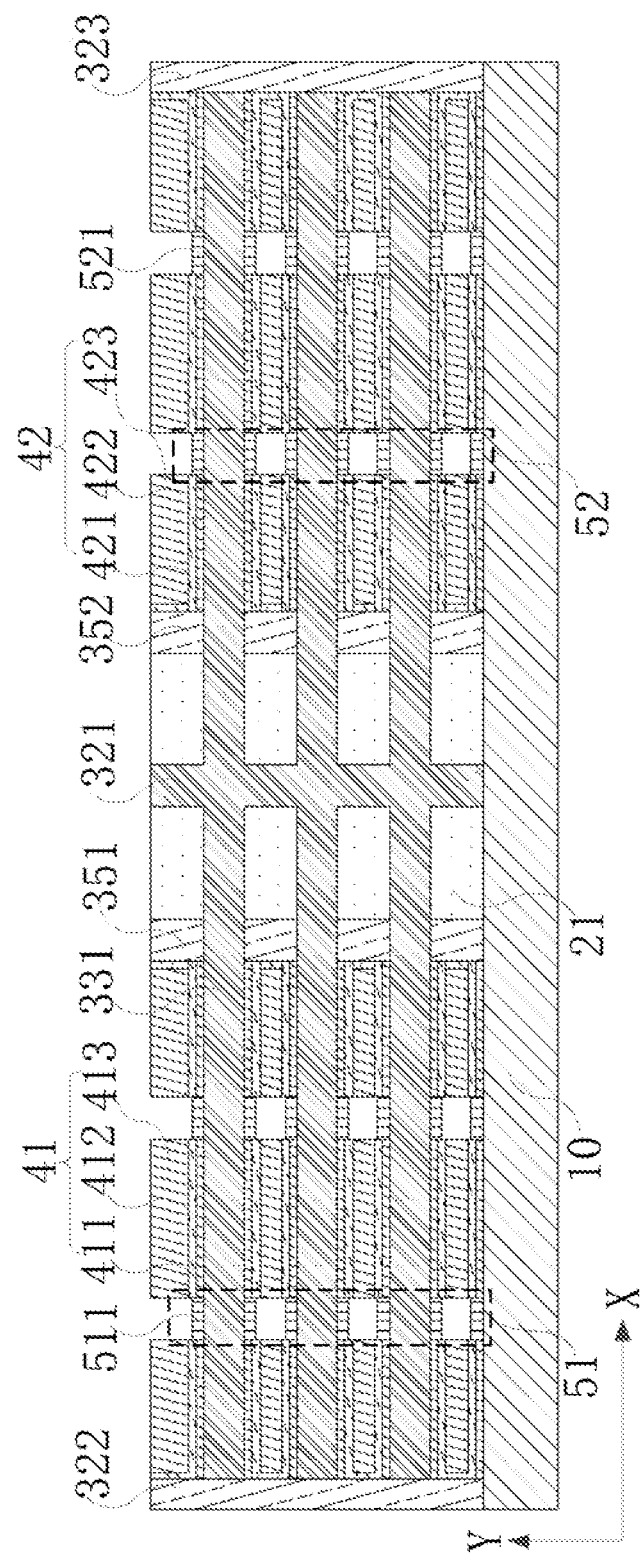
FIG. 18A is a schematic view of forming a first insulation layer in the method for manufacturing a semiconductor structure.
Figure 18B:
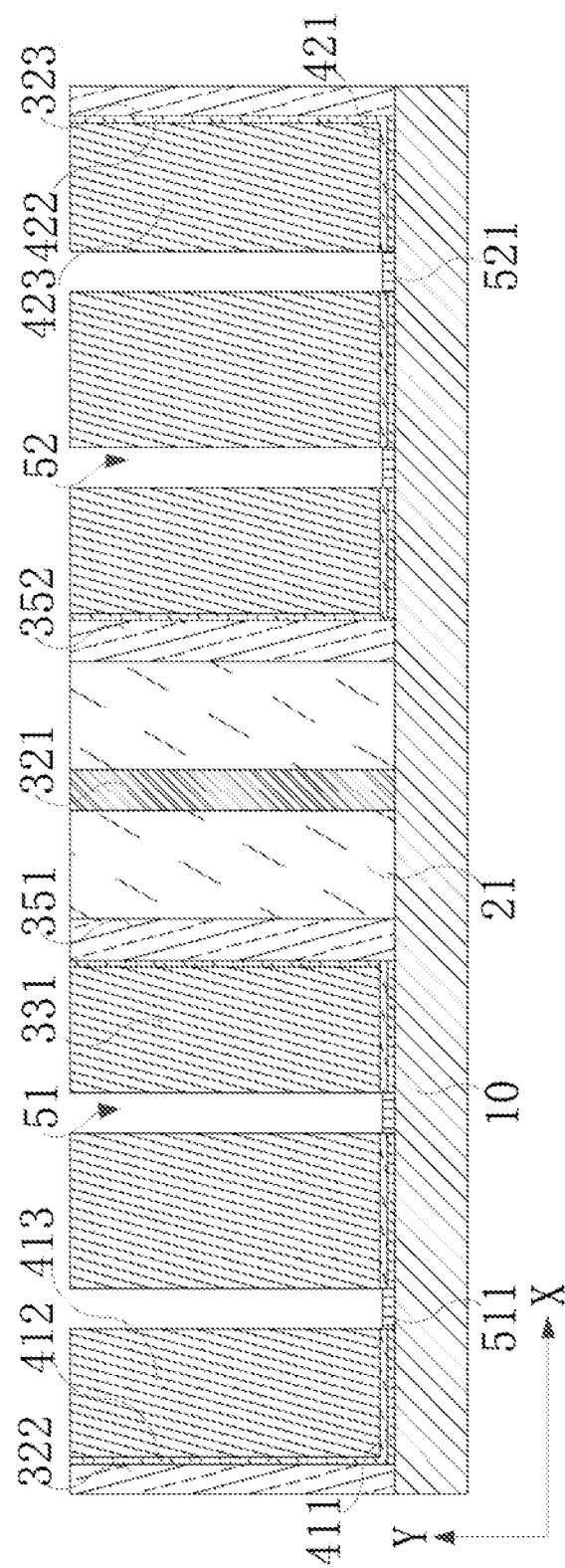
FIG. 18B is another schematic view of forming a first insulation layer in the method for manufacturing a semiconductor structure.

Referring to FIG. 18A to FIG. 18B below, after the plurality of first segmentation trenches 51 are formed, the method further includes the follows.

At S105, a first insulation layer is formed in the first segmentation trench. The first insulation layer is disposed between the first lower electrode layers of the adjacent capacitors. The first insulation layer covers the sidewall surface of the first support column corresponding to the first segmentation trench and the substrate.

In some embodiments, a material of the first insulation layer 511 may include a material having a high dielectric constant, silicon oxide, silicon nitride or silicon oxynitride, to achieve an insulation effect between the corresponding first lower electrode layers 411 of the adjacent capacitors. In this embodiment, the material of the first insulation layer 511 may be the material having a high dielectric constant, so that insulation between the corresponding first lower electrode layers 411 of the adjacent capacitors is further improved.

Referring to FIG. 19A, FIG. 19B, FIG. 19C and FIG. 19D, after the first insulation layers 511 are formed in the first segmentation trenches 51, the method further includes the following. At S106, a conductive material is formed in the first segmentation trench, to electrically connect the corresponding first upper electrode layers of the adjacent capacitors to one another.

In a specific example, the conductive material may be metal or metal alloy. In the X-axis direction, in the first capacitive structures 41 in the same horizontal plane, the corresponding first upper electrode layers 413 of the adjacent capacitors are electrically connected to each other by means of the conductive material. In this embodiment, the conductive material may be the same as that of the first upper electrode layer 413. In the X-axis direction, the first capacitive structures 41 in the same horizontal plane share the same first upper electrode layer 413, so that the corresponding first upper electrode layers 413 of the adjacent capacitors are electrically connected to each other. The corresponding first lower electrode layers 411 of the adjacent capacitors may be electrically connected to each other by the first support columns 331, and the corresponding first upper electrode layers 413 of the adjacent capacitors are electrically connected to each other, so that a parallel connection between the adjacent capacitors can be realized, thereby increasing the capacitance of the first capacitive assembly 61. Therefore, the performance of the semiconductor structure can be improved. For example, referring to FIG. 19D, the thickness H3 of the first insulation layer 511 is greater than the thickness H1 of the first lower electrode layer 411, so that the insulation between the corresponding first lower electrode layers 411 of the adjacent capacitors is guaranteed. The thickness H3 of the first insulation layer 511 is less than the sum H2 of thickness of the first lower electrode layer 411 and the thickness of the first dielectric layer 412, so that electrical connection between the corresponding first upper electrode layers 413 of the adjacent capacitors can be facilitated, thereby guaranteeing the parallel connection between the adjacent capacitors.

An embodiment of the disclosure further provides a method for manufacturing a semiconductor structure, including: providing a substrate 10; forming a plurality of first support columns 331, where the plurality of first support columns 331 are disposed on the substrate 10 in parallel and spaced apart from each other, and are located in a same plane parallel to the substrate 10; forming a first capacitive structure 41 including a first lower electrode layer 411, a first dielectric layer 412 and a first upper electrode layer 413, the first lower electrode layer 411 covers the substrate 10 and sidewall surfaces of the first support columns 331, the first dielectric layer 412 covers the first lower electrode layer 411, and the first upper electrode layer 413 covers the first dielectric layer 412; forming a plurality of first segmentation trenches 51 that are disposed on the substrate 10 in parallel and spaced apart from each other, an extending direction of the first segmentation trenches 51 is perpendicular to the first support columns 331, and the first segmentation trenches 51 divide the first capacitive structure 41 into a plurality of capacitors; forming a first insulation layer 511 in the first segmentation trench 51, where the first insulation layer 511 is located between the first lower electrode layers 411 of the adjacent capacitors, and the first insulation layer 511 covers the sidewall surface of the first support column 331 corresponding to the first segmentation trench 51 and the substrate 10; and filling a conductive material into the first segmentation trench 51, to electrically connect the corresponding first upper electrode layers 413 of the adjacent capacitors to one another. The first insulation layer 511 isolates the adjacent capacitors from one another, the corresponding first lower electrode layers 411 of the adjacent capacitors are electrically connected to each other by the first support column 331, and the corresponding first upper electrode layers 413 of the adjacent capacitors are electrically connected to each other, so that a parallel connection between the adjacent capacitors can be realized, thereby increasing capacitance. Therefore, the performance of the semiconductor structure can be improved.

Referring to FIG. 6A, after the second grooves 32 are formed, the second grooves 32 divide the sacrificial layer 20 into a first area 81 and a second area 82. The first area 81 is configured to form a plurality of first capacitive assemblies 61 arranged in stack. Referring to FIG. 6A to FIG. 8C, while the first support columns 331 are formed in the first area 81, second support columns 332 are also formed in the second area 82. The second support columns 332 are disposed symmetrically with the first support columns 331 are. The structure and material of the second support columns 332 would not described herein again.

Referring to FIG. 9A and FIG. 11B, while the first support columns 331 are formed, the method further includes: forming an isolation portion 70. The third grooves 34 further divide the sacrificial layer 20 in the second area 82 into a plurality of areas, so as to form a plurality of capacitors in the plurality of areas in the subsequent operation. Referring to FIG. 10A, the isolation portion 70 is located between the adjacent third grooves 34, and configured to isolate the capacitors subsequently formed in the first area 81 from the capacitors subsequently formed in the second area 82. The isolation portion 70 further includes an intermediate support layer 321. One side of the intermediate support layer 321 is connected to the first support column 331, and the other side of the intermediate support layer 321 is connected to the second support column 332, to electrically connect the first support columns 331 with the second support columns 332 through the intermediate support layer 321. In this embodiment, since the intermediate support layer 321, the first support column 331 and the second support column 332 have a same material, the intermediate support layer, the first support column and the second support column are synchronously formed by means of a same deposition process. Therefore, the production efficiency of the semiconductor structure can be enhanced. The isolation portion 70 further includes a sacrificial layer 20. Part of the sacrificial layer 20 is located between the intermediate support layer 321 and the first support layer 351, and part of sacrificial layer 20 is disposed around the sidewall of the first support column 331. Part of the sacrificial layer 20 is also located between the intermediate support layer 321 and the second support layer 322, and part of sacrificial layer 20 is disposed around the sidewall of the second support column 332.

Referring to FIG. 10A and FIG. 10B, the second area 82 further includes a plurality of filling sidewalls 35. Referring to FIG. 11A to FIG. 11B, while the first support layers 351 are formed in the filling sidewalls 35, third support layers 352 are also formed. The third support layers 352 are located in the second area 82. In addition, the third support layers 352 are disposed symmetrically with the first support columns 351, so that the structure and material of the third support layers 352 are not described herein again.

Referring to FIG. 12A and FIG. 12B, while part of the sacrificial layer 20 and the filling layer 311 are removed to retain the first support columns 331 and the first support layers 351, the method further includes: removing part of the sacrificial layer 20 and the filling layer 311 in the second area 82 with the second support columns 332 and the third support layers 352 being retained, to form filling space. Referring to FIG. 13A to FIG. 14B, while the plurality of first capacitive assemblies 61 arranged in stack are formed in an area 811, the method further includes: forming a plurality of second capacitive assemblies 62 stacked in the direction perpendicular to the substrate 10 (that is, in the Y-axis direction). The isolation portion 70 is located between the first capacitive assemblies 61 and the second capacitive assemblies 62. The second capacitive assemblies 62 and the first capacitive assemblies 61 are symmetrically disposed with respect to the isolation portion 70. The second capacitive assemblies 62 are located in an area 821. The second capacitive structure 42 includes a second lower electrode layer 421, a second dielectric layer and a second upper electrode layer 423, and the structure and material of the second capacitive structure are not described herein again.

Referring to FIG. 15A and FIG. 15B, the removing part of the intermediate support layer 321 further includes: removing the intermediate support layer 321 on a right side of the second capacitive structure 42 to form the second groove 32. Referring to FIG. 16A to FIG. 16B, while the second support layers 322 are formed, fourth support layers 323 are also formed. The fourth support layers 323 are located on a side of the second capacitive structure 42 away from the isolation portion 70. In addition, the fourth support layers 323 symmetrically disposed with the second support layers 322. The structure and material of the fourth support layers 323 are not described herein again.

Referring to FIG. 17A and FIG. 17B, while the first segmentation trenches 51 are formed, the method further includes: removing the third support layer 352 to form second segmentation trenches 52. Through the arrangement of the plurality of second segmentation trenches 52, the second capacitive structures 42 in the same plane are divided into the plurality of capacitors. Referring to FIG. 18A and FIG. 18B, while the second insulation layers 521 are formed in the second segmentation trenches 52, the method further includes: forming the second insulation layers 521 in the second segmentation trenches 52. The second insulation layers 521 are located between the second lower electrode layers 421 of the adjacent capacitors. The second insulation layers 521 cover sidewall surfaces of the second support columns 332 corresponding to the second segmentation trenches 52 and the substrate 10. The structure and material of the second insulation layers 521 are not described herein again. Likewise, a thickness of the second insulation layer 521 is greater than a thickness of the second lower electrode layer 421, so that the insulation between the corresponding second lower electrode layers 421 of the adjacent capacitors is guaranteed. In addition, the thickness of the second insulation layer 521 is less than the sum of thicknesses of the second lower electrode layer 421 and the second dielectric layer 422, so that electrical connection between the corresponding second upper electrode layers 423 of the adjacent capacitors can be facilitated, thereby guaranteeing a parallel connection between the adjacent capacitors.

Figure 19A:
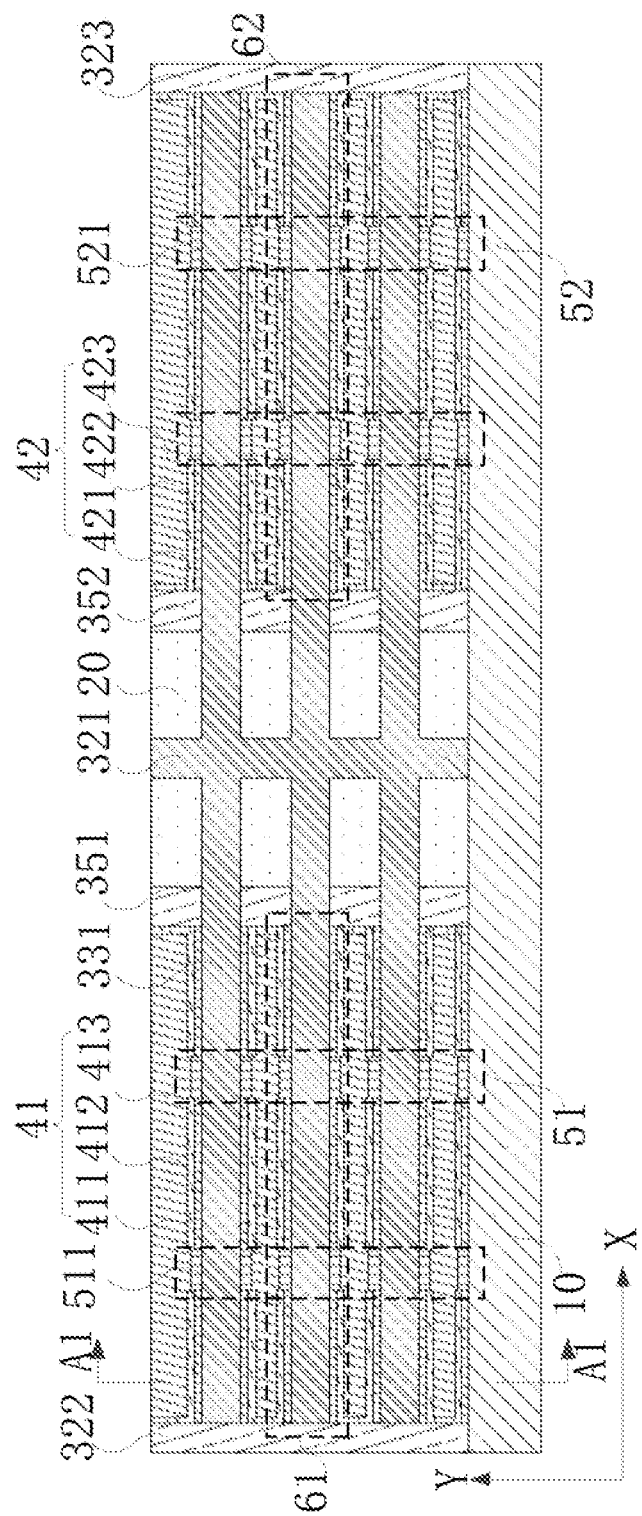
FIG. 19A is a schematic view of filling a conductive material in the method for manufacturing a semiconductor structure.
Figure 19B:
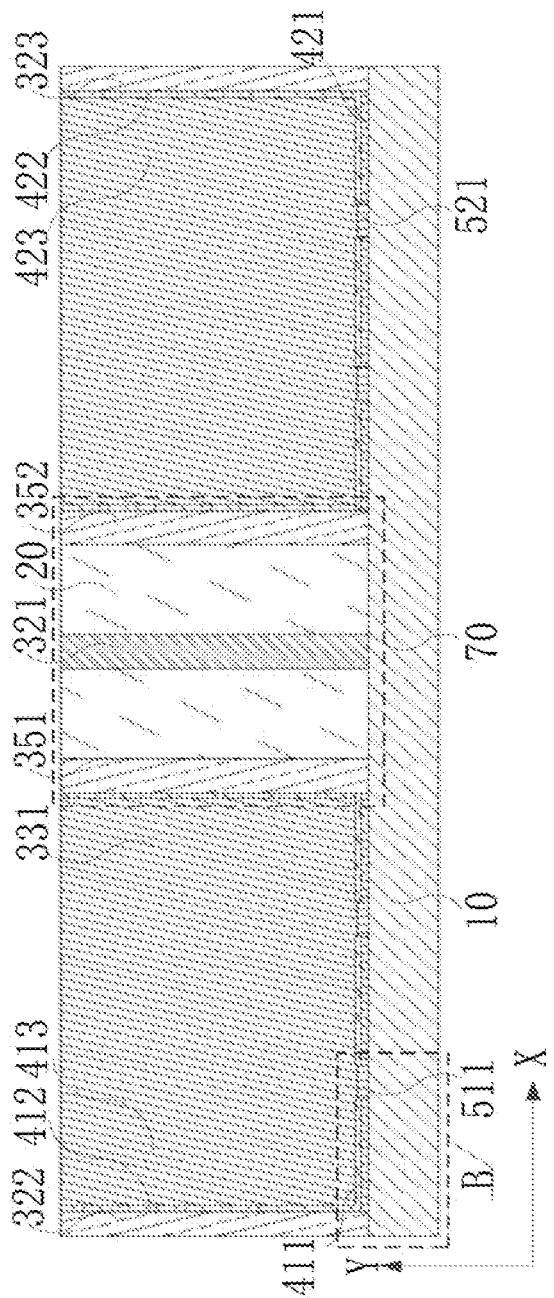
FIG. 19B is another schematic view of filling a conductive material in the method for manufacturing a semiconductor structure.
Figure 19C:
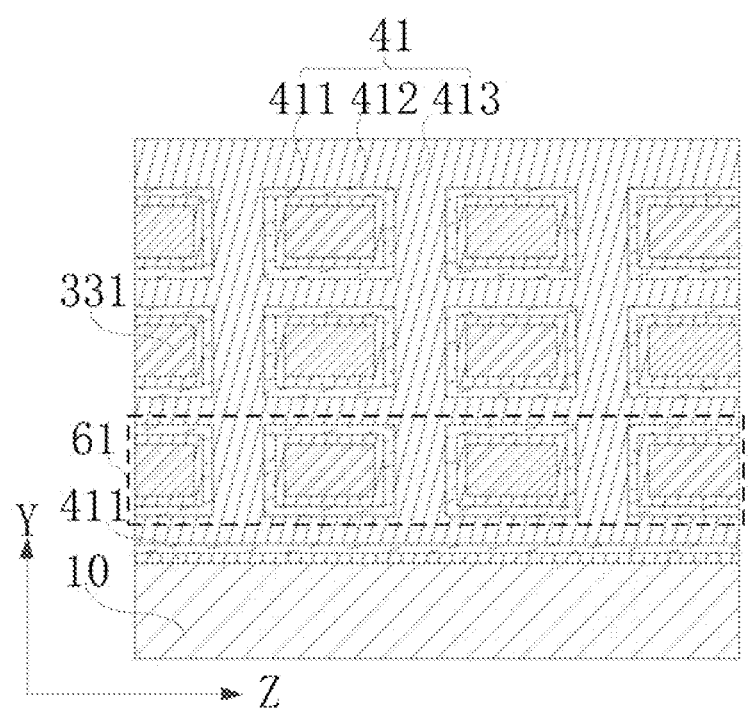
FIG. 19C is a cross-sectional view of A1-A1 in FIG. 19A.
Figure 19D:
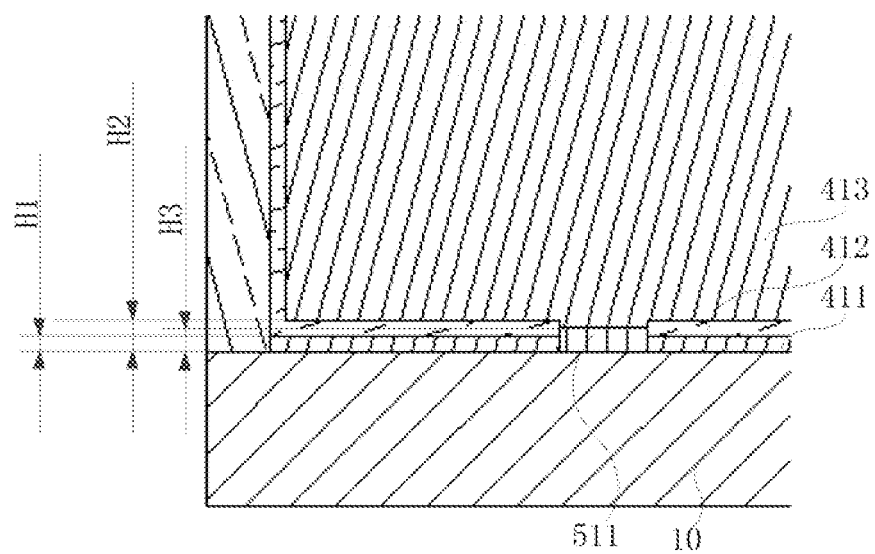
FIG. 19D is a partial enlarged view of B in FIG. 19C.

Referring to FIG. 19A and FIG. 19B, while the conductive material is filled in the first segmentation trench SI, the method further includes: filling the conductive material in the second segmentation trench 52, to electrically connect the corresponding second upper electrode layers 423 of the adjacent capacitors to each other. In this embodiment, the conductive material may be the same as that of the second upper electrode layer 423. In the X-axis direction, the second capacitive structures 42 in the same horizontal plane share the same second upper electrode layer 423, so that the corresponding second upper electrode layers 423 of the adjacent capacitors are electrically connected to each other. The corresponding second lower electrode layers 421 of the adjacent capacitors may be electrically connected to each other by the second support columns 332, and the corresponding second upper electrode layers 423 of the adjacent capacitors are electrically connected to each other, so that a parallel connection between the adjacent capacitors can be realized, thereby increasing the capacitance of the second capacitive assembly 62 can be increased. Therefore, the performance of the semiconductor structure can be further improved.

The above various embodiments are only used to illustrate the technical solutions of the disclosure and not used to limit the same. Although the disclosure has been described in detail with reference to the foregoing embodiments, for those of ordinary skill in the art, they can still modify the technical solutions described in the foregoing embodiments, or equivalently replace part or all of the technical features, all these modifications and replacements shall not cause the essence of the corresponding technical solutions to depart from the scope of the technical solutions of the embodiments of the disclosure.

The invention claimed is:

1. A semiconductor structure, comprising:
a plurality of first capacitive structures located on a substrate, a plurality of first support columns are disposed on the substrate in parallel and spaced apart from each other, the plurality of first support columns are located in a same plane parallel to the substrate, each one of the plurality of first capacitive structures comprises a first lower electrode layer, a first dielectric layer and a first upper electrode layer, the first lower electrode layer covers the substrate and sidewall surfaces of the first support columns, the first dielectric layer covers the first lower electrode layer, and the first upper electrode layer covers the first dielectric layer; and
a plurality of first segmentation trenches that are disposed on the substrate in parallel and spaced apart from each other, wherein an extending direction of the first segmentation trenches is perpendicular to the first support columns, the first segmentation trenches divide each one of the plurality of first capacitive structures into a plurality of capacitors, a first insulation layer is disposed between corresponding first lower electrode layers of adjacent capacitors, the first insulation layer covers the substrate and the sidewall surface of the first support column corresponding to the first segmentation trench, and the corresponding first upper electrode layers of the adjacent capacitors are electrically connected to each other.

2. The semiconductor structure of claim 1, wherein a material of the first insulation layer comprises a material having a high dielectric constant, silicon oxide, silicon nitride or silicon oxynitride.

3. The semiconductor structure of claim 2, wherein a thickness of the first insulation layer is greater than a thickness of the first lower electrode layer, and is less than a sum of the thickness of the first lower electrode layer and a thickness of the first dielectric layer.

4. The semiconductor structure of claim 1, wherein a material of the first support column comprises single-crystal silicon, single-crystal germanium, single-crystal silicon germanium, or indium gallium zinc oxide.

5. The semiconductor structure of claim 3, wherein the plurality of first capacitive structures and the plurality of first support columns from a plurality of first capacitive assemblies; each one of the plurality of first capacitive assemblies includes a first capacitor structure that belongs to the plurality of first capacitive structures and a first support column that belongs to the plurality of first support columns, in a direction perpendicular to the substrate, the plurality of first capacitive assemblies arranged in stack are disposed on the substrate; and corresponding first upper electrode layers of adjacent first capacitive assemblies are electrically connected to each other.

6. The semiconductor structure of claim 5, further comprising a first support layer and a second support layer covering the substrate, wherein the first support layer and the second support layer surround the sidewall surface of the first support column; each first capacitive assembly is located between the first support layer and the second support layer; and the first dielectric layer covers sidewalls of the first support layer and the second support layer.

7. The semiconductor structure of claim 5, further comprising an isolation portion located on the substrate and a plurality of second capacitive assemblies, wherein in the direction perpendicular to the substrate, the plurality of second capacitive assemblies arranged in stack are disposed on the substrate; the isolation portion is located between the first capacitive assemblies and the second capacitive assemblies; and the first capacitive assemblies and the second capacitive assemblies are symmetrically disposed with respect to the isolation portion.

8. A method for manufacturing a semiconductor structure, comprising:
providing a substrate;
forming a plurality of first support columns that are disposed on the substrate in parallel and spaced apart from each other, the plurality of first support columns are located in a same plane parallel to the substrate;
forming a plurality of first capacitive structures comprising a first lower electrode layer, a first dielectric layer and a first upper electrode layer, wherein the first lower electrode layer covers the substrate and sidewall surfaces of the first support columns, the first dielectric layer covers the first lower electrode layer, and the first upper electrode layer covers the first dielectric layer;

forming a plurality of first segmentation trenches that are disposed on the substrate in parallel and spaced apart from each other, wherein an extending direction of the first segmentation trenches is perpendicular to the first support columns, and the first segmentation trenches divide each one of the plurality of first capacitive structures into a plurality of capacitors;

forming a first insulation layer in the first segmentation trench, wherein the first insulation layer is disposed between the first lower electrode layers of adjacent capacitors, and the first insulation layer covers the sidewall surface of the first support column corresponding to the first segmentation trench and the substrate; and filling a conductive material into the first segmentation trench, to electrically connect the corresponding first upper electrode layers of the adjacent capacitors to one another.

9. The method for manufacturing a semiconductor structure of claim 8, wherein a material of the first insulation layer comprises a material having a high dielectric constant, silicon oxide, silicon nitride or silicon oxynitride.

10. The method for manufacturing a semiconductor structure of claim 8, wherein a thickness of the first insulation layer is greater than a thickness of the first lower electrode layer, and is less than a sum of thickness of the first lower electrode layer and a thickness of the first dielectric layer.

11. The method for manufacturing a semiconductor structure of claim 9, wherein a material of the first support column comprises single-crystal silicon, single-crystal germanium, single-crystal silicon germanium, or indium gallium zinc oxide.

12. The method for manufacturing a semiconductor structure of claim 11, wherein the forming a first support column comprises:

forming a sacrificial layer covering the substrate;

removing a part of the sacrificial layer to form a plurality of first grooves disposed on the substrate in parallel and spaced apart from each other;

forming filling layers in the first grooves;

removing a part of the sacrificial layer and a part of the filling layers to form a plurality of second grooves, wherein the plurality of second grooves are disposed on the substrate in parallel and spaced apart from each other, and an extending direction of the second grooves is perpendicular to the first grooves;

removing a part of the sacrificial layer to form a plurality of filling channels spaced from one another and disposed parallel to the first grooves; and forming the first support column in each filling channel.

13. The method for manufacturing a semiconductor structure of claim 12, wherein the sacrificial layer comprises a first sacrificial layer and a second sacrificial layer that are alternately disposed and stacked onto one another; the removing a part of the sacrificial layer to form filling channels comprises:

removing the second sacrificial layer of the sacrificial layer with the first sacrificial layer being retained, to form filling structures stacked on the substrate, wherein, in a direction perpendicular to the substrate, each filling structure comprises the filling channels that are spaced apart from each other and are disposed in parallel; and the forming the plurality of first capacitive structures further comprises: forming a plurality of first capacitive assemblies which are formed by the plurality of first capacitive structures and the plurality of first support columns and are stacked in the direction perpendicular to the substrate, wherein each one of the plurality of first capacitive assemblies includes a first capacitor structure that belongs to the plurality of first capacitive structures and a first support column that belongs to the plurality of first support columns, wherein corresponding first upper electrode layers of adjacent first capacitive assemblies are electrically connected to each other.

14. The method for manufacturing a semiconductor structure of claim 13, wherein, while the first support columns are formed in the filling channels, the method further comprises:

forming intermediate support layers in the second grooves; and the forming the plurality of first capacitive structures further comprises:

removing a part of the intermediate support layers; and forming second support layers in a part of the second grooves.

15. The method for manufacturing a semiconductor structure of claim 14, wherein, after the first support columns are formed in the filling channels, the method further comprises:

removing a part of the filling layers to form a plurality of third grooves, wherein the plurality of third grooves are disposed on the substrate in parallel and spaced apart from each other, and an extending direction of the third grooves is perpendicular to the first grooves;

removing a part of the sacrificial layer corresponding to sidewalls of the third grooves with the first support columns being retained, to form filling sidewalls; and forming first support layers in a part of the filling sidewalls, wherein the first support layers surround the sidewall surfaces of the first support columns.

16. The method for manufacturing a semiconductor structure of claim 15, wherein the forming the plurality of first capacitive structures further comprises:

removing a part of the sacrificial layer and the filling layers to retain the first support columns and the first support layers;

forming the first lower electrode layers on the first support columns and the substrate by means of a selective growth process; and successively forming the first dielectric layers and the first upper electrode layers.

17. The method for manufacturing a semiconductor structure of claim 15, wherein the forming first segmentation trenches comprises:

removing a part of the first support layers.

18. The method for manufacturing a semiconductor structure of claim 14, further comprising:

forming an isolation portion while the first support columns are formed; and the forming a plurality of first capacitive assemblies further comprises: forming a plurality of second capacitive assemblies stacked in the direction perpendicular to the substrate, wherein the isolation portion is located between the first capacitive assemblies and the second capacitive assemblies, and the first capacitive assemblies and the second capacitive assemblies are symmetrical with respect to the isolation portion.

* * * * *